US012718848B2

(12) United States Patent
Chung et al.

(10) Patent No.: US 12,718,848 B2
(45) Date of Patent: Aug. 25, 2026

(54) INTEGRATED CIRCUIT DEVICE, MEMORY CELL AND METHOD

(71) Applicant: TAIWAN SEMICONDUCTOR MANUFACTURING COMPANY, LTD., Hsinchu (TW)

(72) Inventors: Yen Lin Chung, Hsinchu (TW); Kao-Cheng Lin, Hsinchu (TW); Wei-Cheng Wu, Hsinchu (TW); Pei-Yuan Li, Hsinchu (TW); Chien-Chen Lin, Hsinchu (TW); Chun-Tse Chou, Hsinchu (TW); Chien Hui Huang, Hsinchu (TW); Yung-Ning Tu, Hsinchu (TW); Shang Lin Wu, Hsinchu (TW); Chia-Che Chung, Hsinchu (TW); Chia-Chi Hung, Hsinchu (TW); Wei Min Chan, Hsinchu (TW); Yen-Huei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 91 days.

(21) Appl. No.: 18/366,885

(22) Filed: Aug. 8, 2023

(65) Prior Publication Data

US 2024/0312492 A1 Sep. 19, 2024

Related U.S. Application Data

(60) Provisional application No. 63/490,666, filed on Mar. 16, 2023.

(51) Int. Cl.
*G11C 11/419* (2006.01)
*G11C 5/06* (2006.01)
*H10B 10/00* (2023.01)

(52) U.S. Cl.
CPC ............ *G11C 5/063* (2013.01); *G11C 11/419* (2013.01); *H10B 10/125* (2023.02)

(58) Field of Classification Search
CPC ...... G11C 11/419; G11C 5/063; H10B 10/125
USPC ........................................................... 365/63
See application file for complete search history.

(56) References Cited

U.S. PATENT DOCUMENTS

| | | | | |
|---|---|---|---|---|
| 11,114,446 | B2 * | 9/2021 | Wang | G11C 11/412 |
| 2008/0151653 | A1 * | 6/2008 | Ishikura | G11C 29/12 365/201 |
| 2016/0020255 | A1 | 1/2016 | Ratnam et al. | |
| 2019/0279712 | A1 | 9/2019 | Siau et al. | |

(Continued)

FOREIGN PATENT DOCUMENTS

| | | |
|---|---|---|
| TW | 201743328 | 12/2017 |
| TW | 201743333 | 12/2017 |

(Continued)

*Primary Examiner* — Sung Il Cho
(74) *Attorney, Agent, or Firm* — Hauptman Ham, LLP

(57) ABSTRACT

An integrated circuit (IC) device includes a plurality of memory segments. Each memory segment includes a plurality of memory cells, and a local bit line electrically coupled to the plurality of memory cells and arranged on a first side of the IC device. The IC device further includes a global bit line electrically coupled to the plurality of memory segments, and arranged on a second side of the IC device. The second side is opposite the first side in a thickness direction of the IC device.

20 Claims, 16 Drawing Sheets

(56) References Cited

U.S. PATENT DOCUMENTS

| | | | | |
|---|---|---|---|---|
| 2022/0180920 | A1 | 6/2022 | Saito et al. | |
| 2022/0366968 | A1* | 11/2022 | Liu | G11C 11/4096 |
| 2022/0413801 | A1* | 12/2022 | Su | G06F 7/5443 |
| 2023/0095330 | A1* | 3/2023 | Lee | G11C 11/418<br>365/154 |
| 2023/0259331 | A1* | 8/2023 | Chang | G06F 7/5443<br>708/603 |

FOREIGN PATENT DOCUMENTS

| | | |
|---|---|---|
| TW | 202219958 | 5/2022 |
| TW | I789268 | 1/2023 |

* cited by examiner

INTEGRATED CIRCUIT DEVICE, MEMORY CELL AND METHOD

RELATED APPLICATION(S)

This application claims the benefit of U.S. Provisional Application No. 63/490,666, filed Mar. 16, 2023, which is herein incorporated by reference in its entirety.

BACKGROUND

An integrated circuit ("IC") device includes one or more semiconductor devices represented in an IC layout diagram (also referred to as "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

To reduce the sizes of IC devices, sometimes a layer of semiconductor devices is formed, or bonded, over another layer of semiconductor devices. Examples include complementary field effect transistor (CFET) devices in which an upper or top semiconductor device overlies a lower or bottom semiconductor device in a stack configuration.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
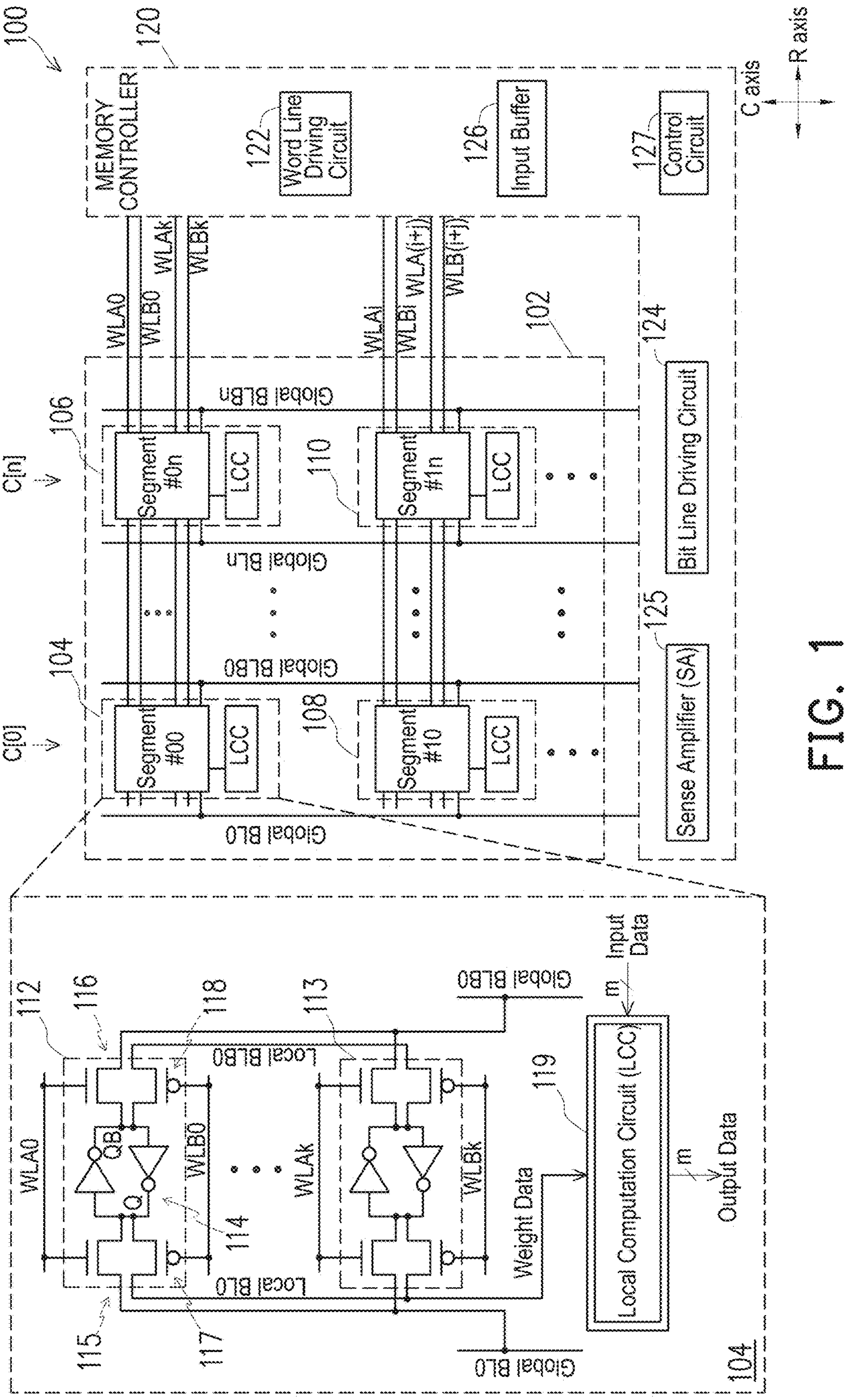
FIG. 1 is a schematic block diagram of a memory device, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Source/drain(s) may refer to a source or a drain, individually or collectively dependent upon the context.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Recent developments in the field of artificial intelligence have resulted in various products and/or applications, including, but not limited to, speech recognition, image processing, machine learning, natural language processing, or the like. Such products and/or applications often use neural networks to process large amounts of data for learning, training, cognitive computing, or the like. Memory devices configured to perform computing-in-memory (CIM) operations (also referred to herein as CIM memory devices) are usable in neural network applications, as well as other applications. A CIM memory device includes a memory array, segment or macro configured to store weight data to be used, together with input data, in one or more CIM operations.

In some embodiments, an IC device comprises a memory device having a plurality of memory segments, each comprising a plurality of memory cells. In each memory segment, a local bit line electrically couples the memory cells to a local computation circuit. The local bit line is configured for supplying weight data from the memory cells in the memory segment to the local computation circuit in a CIM operation. A global bit line is electrically coupled to the memory segments. The global bit line is configured for retrieving data from one or more memory cells in the memory segments in a read operation. In some embodiments, the local bit line and global bit line are arranged at opposite sides in a thickness direction of the IC device. For example, the local bit line is on a back side and the global bit line is on a front side of the IC device, or vice versa. In at least one embodiment, each memory cell comprises a plurality of CFET devices and/or is a dual-port static random-access memory (SRAM) memory cell. It is possible, in one or more embodiments, to avoid read disturb between the memory segments in CIM operations of the memory segments. In at least one embodiment, it is possible to simplify circuitry by omitting one or more global word lines and associated local multiplexers (or switches) required in other approaches. One or more further advantages in accordance with some embodiments include, but are not limited to, reduced coupling noise in CIM operations, reduced chip area, reduced number of signal lines, or the like.

FIG. 1 is a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities. In some embodiments, a memory device comprises computation circuits for CIM operations, as described herein.

The memory device 100 comprises a memory array 102 of memory cells, and a memory controller 120 coupled to the memory array 102 and configured to control various operations of the memory cells including, but not limited to, a read operation, a write operation, a CIM operation, or the like. In the memory array 102, the memory cells are arranged in a plurality of columns and rows. Columns and rows in a memory array are sometimes referred to as memory columns and memory rows. The memory columns extend in a column direction, designated as C axis in the drawings. The memory rows extend in a row direction transverse to the column direction, and designated as R axis in the drawings. Example memory types of the memory cells of the memory array 102 include, but are not limited to, static random-access memory (SRAM), resistive RAM (RRAM), magnetoresistive RAM (MRAM), phase change RAM (PCRAM), spin transfer torque RAM (STTRAM), floating-gate metal-oxide-semiconductor field-effect transistors (FGMOS), spintronics, or the like. In one or more example embodiments described herein, the memory cells of the memory array 102 include SRAM memory cells.

The memory device 100 comprises a plurality of memory segments 104, 106, 108, 110, each comprising a plurality (or set) of memory cells and a local computation circuit (LCC). In the example configuration in FIG. 1A, the memory segments include corresponding sets of memory cells indicated as Segment #00 to Segment #0n (where n is a natural number), Segment #10 to Segment #1n, or the like. Other memory segment configurations are within the scopes of various embodiments. In some embodiments, a memory segment comprises more than one memory columns and/or more than one memory rows. In at least one embodiment, different memory segments include different numbers of memory columns and/or different numbers of memory rows. An example memory segment 104 corresponding to Segment #00 is described in detail herein. Other memory segments of the memory device 100 are configured similarly to the memory segment 104.

The memory device 100 comprises a plurality of word lines along the memory rows, and a plurality of bit lines extending along the memory columns of the memory array 102. Each memory cell of the memory array 102 is electrically coupled to at least one word line and at least one bit line. The word lines are sometimes referred to or designated herein by labels or reference numerals including "WL", and the bit lines are sometimes referred to or designated herein by labels or reference numerals including "BL". The word lines are configured for transmitting addresses of memory cells to be read from, and/or to be written to, or the like. The word lines are sometimes referred to as "address lines." The bit lines are configured for transmitting data to be written to, and/or read from, the memory cells indicated by the addresses on the corresponding word lines, or the like. The bit lines are sometimes referred to as "data lines." Various numbers of word lines and/or bit lines in the memory device 100 are within the scope of various embodiments.

In some embodiments, some of the word lines and/or bit lines are arranged on a front side of the memory device, while other word lines and/or bit lines are arranged on a back side of the memory device. As described herein, a front side word line (or bit line) is a word line (or bit line) over the memory array or at a front side of a substrate over which the memory array is formed, and a back side word line (or bit line) is a word line (or bit line) under the memory array or at a back side of the substrate. In the drawings, front side word lines (or bit lines) are designated with labels including "FS," whereas back side word lines (or bit lines) are designated with labels including "BS." Unless otherwise specified, descriptions of word lines herein are applicable to both front side word lines and back side word lines, and descriptions of bit lines herein are applicable to both front side bit lines and back side bit lines. A front side word line is an example of one of a first word line and a second word line, and a back side word line is an example of the other of the first word line and the second word line. A front side bit line is an example of one of a first bit line and a second bit line, and a back side bit line is an example of the other of the first bit line and the second bit line. The front side is an example of one of a first side and a second side, and the back side is an example of the other of the first side and the second side.

The bit lines in the memory device 100 comprise global bit lines and local bit lines. The global bit lines are sometimes referred to or designated herein by labels or reference numerals including "Global BL", and the local bit lines are sometimes referred to or designated herein by labels or reference numerals including "Local BL". A global bit line is an example of one of a first bit line and a second bit line, and a local bit line is an example of the other of the first bit line and the second bit line.

A global bit line is electrically coupled to a plurality of memory segments MS of the memory device 100, whereas a local bit line is electrically coupled to a plurality of memory cells in a memory segment. In some embodiments, a local bit line of one memory segment is not electrically coupled to memory cells in another memory segment. In the example configuration in FIG. 1, global bit lines Global BL0, Global BLB0 are electrically coupled to the memory segments 104, 108, or the like, along a memory column C[0], and global bit lines Global BLn, Global BLBn are electrically coupled to the memory segments 106, 110, or the like, along a memory column C[n], or the like. The global bit lines Global BL0, Global BLB0 form a pair of differential bit lines, the global bit lines Global BLn, Global BLBn form a further pair of differential bit lines, or the like. In some embodiments, one bit line in a pair of differential bit lines is omitted. For example, the global bit lines Global BLB0, Global BLBn, or the like, are omitted in one or more embodiments. In some embodiments, one global bit line in a pair of differential bit lines is a front side bit line, whereas the other global bit line is a back side bit line. Examples of local bit lines are described herein with respect to the memory segment 104.

The memory controller 120 comprises a word line driving circuit 122, a bit line driving circuit 124, a sense amplifier (SA) 125, an input buffer 126, and a control circuit 127. In at least one embodiment, the memory controller 120 further comprises one or more clock generators for providing clock signals for various components of the memory device 100, one or more input/output (I/O) circuits for data exchange with external devices, and/or one or more sub-controllers for controlling various operations in the memory device 100. The described memory device configuration is an example, and other memory device configurations are within the scopes of various embodiments.

The word line driving circuit 122 is electrically coupled to the memory cells of the memory array 102 via the corresponding word lines. The word line driving circuit 122 is configured to decode a row address of the memory cell selected to be accessed, e.g., in a read operation, a write operation or a CIM operation. The word line driving circuit 122 is configured to supply an access voltage to the selected word line corresponding to the decoded row address, and a different voltage to the other, unselected word lines.

The bit line driving circuit 124 is electrically coupled to the memory cells of the memory array 102 via the corresponding bit lines. The bit line driving circuit 124 is configured to decode a column address of the memory cell selected to be accessed. In some embodiments, for a read operation or a write operation, the bit line driving circuit 124 is configured to supply a voltage to the selected bit line corresponding to the decoded column address, and a different voltage to the other, unselected bit lines.

The SA 125 is configured to, in a read operation, sense data read from the accessed memory cells and retrieved through the corresponding bit line(s).

The input buffer 126 is configured to receive input data. In some embodiments, the input data are received from external circuitry outside the memory device 100, for example, a processor. In at least one embodiment, the input data are received through one or more I/O circuits (not shown) of the memory controller 120 and are forwarded via the input buffer 126 to the LCC(s) of one or more of the memory segments. Example input buffers include, but are not limited to, registers, memory cells, or other circuit elements configured for data storage.

The control circuit 127 is electrically coupled to one or more of weight buffers (not shown), LCCs, word line driving circuit 122, bit line driving circuit 124, SA 125, input buffer 126 to coordinate operations of these circuits, drivers and/or buffers in the overall operation of the memory device 100. For example, the control circuit 127 is configured to generate various control signals for controlling operations of one or more of the weight buffers, LCCs, word line driving circuit 122, SA 125, bit line driving circuit 124, input buffer 126, or the like.

An enlarged schematic circuit diagram of the memory segment 104 is illustrated in FIG. 1. The memory segment 104 comprises a plurality of memory cells arranged along the C axis. For simplicity, a first memory cell 112 and a last memory cell 113 are illustrated in FIG. 1, whereas other memory cells between the memory cell 112 and memory cell 113 along the C axis are omitted. The memory cell 112 is described in detail herein. Other memory cells of the memory segment 104 and/or memory cells of the other memory segments of the memory device 100 are configured similarly to the memory cell 112.

The memory cell 112 comprises a data storage circuit 114, and pass gate (PG) devices 115, 116, 117, 118. The PG device 115 is electrically coupled between a node Q of the data storage circuit 114 and the global bit line Global BL0. The PG device 116 is electrically coupled between a node QB of the data storage circuit 114 and the global bit line Global BLB0. The PG device 117 is electrically coupled between the node Q and a local bit line Local BL0. The PG device 118 is electrically coupled between the node QB and a further local bit line Local BLB0. The local bit line Local BL0 electrically couples the memory cells in the memory segment 104 to an LCC 119 of the memory segment 104. The local bit line Local BL0, Local BLB0 form a pair of differential bit lines. In some embodiments, one local bit line in a pair of differential bit lines is omitted. For example, the local bit line Local BLB0 is omitted in one or more embodiments. In some embodiments, one local bit line in a pair of differential bit lines is a front side bit line, whereas the other local bit line is a back side bit line.

The PG devices 115, 116 are electrically coupled to a word line WLA0, and are configured to be controlled by an access voltage on the word line WLA0. The PG devices 117, 118 are electrically coupled to a word line WLB0, and are configured to be controlled by an access voltage on the word line WLB0. In some embodiments, the word lines WLA0, WLB0 are configured to be controlled independently from each other. For example, the word lines WLA0, WLB0 are electrically coupled to different word line drivers in the word line driving circuit 122. Other memory cells in the memory segment 104, or in other memory segments, are each coupled to a corresponding pair of word lines (with labels or reference numerals including "WLA" and "WLB"). For example, the memory cell 113 is electrically coupled to a pair of word lines WLAK, WLBk, where k is a natural number. For another example, memory cells in the memory segments 108, 110, or the like, are correspondingly coupled to a pair of word lines WLAi, WLBi, a pair of word lines WLA(i+j), WLB(i+j), or the like, where i and j are natural numbers and i is greater than k. In some embodiments, one word line in a pair of word lines WLA, WLB is a front side word line, whereas the other word line is a back side word line. Each pair of word lines WLA, WLB corresponds to a memory row of the memory array 102, and electrically couples the memory cells in the memory row to the memory controller 120. The described configurations of the memory array 102, and/or memory segments, and/or memory cell are examples. Other configurations are within the scopes of various embodiments.

In some embodiments, the memory segment 104, or another memory segment of the memory device 100, comprises memory cells of more than one memory columns, e.g., l memory columns, where l is a natural number greater than 1. In such a configuration, the memory segment comprises l pairs of local bit lines and is electrically coupled to l pairs of global bit lines, and the LCC 119 is electrically coupled to l local bit lines. Specifically, each of the l pairs of local bit lines and each of the l pairs of global bit lines are electrically coupled to the memory cells in a corresponding memory column among the l memory columns of the memory segment, in a manner similar to that described with respect to FIG. 1. A local bit line corresponding to each of the l memory columns of the memory segment is electrically coupled to the LCC 119, in a manner similar to that described with respect to FIG. 1.

In some embodiments, different memory segments include different numbers and/or different sets of memory rows, or pairs of word lines WLA, WLB. For example, although in the example configuration in FIG. 1, the memory segments 104, 106, or the like, are electrically coupled to the same set of pairs of word lines WLA, WLB (i.e., the pair of word lines WLA0, WLB0 to the pair of WLAK, WLBk), in one or more embodiments, at least one of the memory segments (e.g., the memory segment 106) is electrically coupled to a different set of pairs of word lines WLA, WLB.

In other words, it is possible in one or more embodiments that different memory segments have different sizes in at least one of the C axis or the R axis.

In the example configuration in FIG. 1, each memory cell is a dual-port memory cell. Other number of ports for a memory cell are within the scopes of various embodiments. In at least one embodiment, a port of a memory cell is represented by a set of a word line and at least one bit line (referred to herein as a WL/BL set) which are configured to provide access to the memory cell in a read operation, a write operation, and/or a CIM operation. A multi-port memory cell has several WL/BL sets each of which is configured for at least one of a read operation, a write operation, or a CIM operation. For example, the memory cell 112 comprises a first port corresponding to a first WL/BL set of the word line WLA0 and the pair of global bit lines Global BL0, Global BLB0, and a second port corresponding to a second WL/BL set of the word line WLB0 and the pair of local bit lines Local BL0, Local BLB0. The PG devices 115, 116 are electrically coupled to the first WL/BL set and correspond to the first port of the memory cell 112. The PG devices 117, 118 are electrically coupled to the second WL/BL set and correspond to the second port of the memory cell 112. In the example configuration in FIG. 1, the first port is configured for at least one of a read operation or a write operation, and the second port is configured for a CIM operation, as described herein.

In an example read operation of one or more selected memory cells, the word line driving circuit 122 is configured to access the one or more selected memory cells, by applying an access voltage to the corresponding one or more word lines WLA. For example, when the memory cell 112 is selected for a read operation, the word line driving circuit 122 is configured to apply the access voltage to the word line WLA0. In other words, the word line WLA0 is accessed. The access voltage on the word line WLA0 turns ON the PG devices 115, 116. The turned ON PG devices 115, 116 electrically couple the data storage circuit 114 to the global bit lines Global BL0, Global BLB0. In some embodiments, the global bit lines Global BL0, Global BLB0 have been pre-charged to a pre-charge voltage by a pre-charging circuit (not shown) in the memory controller 120. As the PG devices 115, 116 are turned ON, the datum stored in the data storage circuit 114 causes the pre-charge voltage on the global bit lines Global BL0, Global BLB0 to change and develop a voltage difference between the global bit lines Global BL0, Global BLB0. The global bit lines Global BL0, Global BLB0 are coupled to the SA 125 which detects the voltage difference between the global bit lines Global BL0, Global BLB0, and outputs a signal corresponding to the datum stored in the memory cell 112. In the described read operation, the SA 125 comprises a double-ended sense amplifier coupled to a pair of differential bit lines, i.e., the global bit lines Global BL0, Global BLB0. In at least one embodiment, one of the global bit lines Global BL0, Global BLB0 is omitted, and the SA 125 comprises a single-ended sense amplifier. In the described read operation, the first port corresponding to the word line WLA0 and PG devices 115, 116 is used for accessing the memory cell 112. In at least one embodiment, the PG devices 117, 118 corresponding to the second port remain OFF during a read operation, i.e., the second port is not used in a read operation.

In an example write operation, the word line driving circuit 122 is configured to access one or more selected memory cells, e.g., the memory cell 112, by applying an access voltage to the corresponding one or more word lines WLA, e.g., the word line WLA0, in a manner similar to the described read operation. A write circuit (not shown) in the memory controller 120 is electrically coupled to the global bit lines Global BL0, Global BLB0, and is configured to apply corresponding write voltages through the global bit lines Global BL0, Global BLB0 and the turned ON PG devices 115, 116 to the data storage circuit 114, to write a corresponding datum in the data storage circuit 114. In some embodiments, the datum written to the data storage circuit 114 comprises a weight bit to be subsequently used in a CIM operation, as described herein. In the described write operation, the first port corresponding to the word line WLA0 and PG devices 115, 116 is used for accessing the memory cell 112. In at least one embodiment, the PG devices 117, 118 corresponding to the second port remain OFF during a write operation, i.e., the second port is not used in a write operation.

In an example CIM operation, the second ports corresponding to the word line WLB0 to word line WLBk and the corresponding PG devices, e.g., the PG devices 117, 118, are used for accessing the memory cells in the memory segment 104. The word lines WLB0 to WLBk are sequentially accessed by the word line driving circuit 122. Each time a word line WLB among the word lines WLB0 to WLBk is accessed, the PG devices corresponding to the second port of the memory cell being accessed are turned ON. For example, when the word line WLB0 is accessed, the PG devices 117, 118 are turned ON and electrically coupled the data storage circuit 114 to the local bit lines Local BL0, Local BLB0. A datum, or weight bit, stored in the memory cell 112 is read out through the local bit line Local BL0. Thereafter, a next memory cell (not shown) immediately adjacent to the memory cell 112 along the C axis is accessed, and a next weight bit stored in the next memory cell is read out through the local bit line Local BL0. As the memory cells in the memory segment 104 are sequentially accessed, the weight bits stored in the memory cells are sequentially read out through the local bit line Local BL0. As a result, weight data comprising the weight bits are sequentially read out from the memory cells of the memory segment 104 and are sequentially supplied through the local bit line Local BL0 to the LCC 119.

The LCC 119 is configured to generate output data corresponding to a computation performed on input data and the weight data stored in the memory cells of the memory segment 104. Example computations include, but are not limited to, mathematical operations, logical operations, combination thereof, or the like. In at least one embodiment, the LCC 119 comprises a Multiply Accumulate (MAC) circuit, and the computation comprises a multiplication of one or more multibit weight values represented by the corresponding weight data with one or more multibit input data values represented by the corresponding input data. Further computation circuits configured to perform computations other than a multiplication are within the scopes of various embodiments. In one or more embodiments, the LCC 119 comprises a MAC circuit including one or more multipliers and one or more adders. Each of the multipliers and adders comprises a logic circuit configured to perform a corresponding multiplication or addition operation. Example multipliers include, but are not limited to, NOR gates, AND gates, any other logic gates, combinations of logic gates, or the like. Example adders include, but are not limited to, full adders, half adders, or the like. In some embodiments, the adders in the MAC circuit are coupled to each other to form an adder trec having multiple stages. The described MAC circuit configuration having multipliers and adders is an example. Other MAC circuit configurations are within the scopes of various embodiments. In some embodiments, the described configuration of the LCC 119 is applicable to LCCs of other memory segments in the memory device 100.

In one or more embodiments as described herein, the LCC 119 is configured to multiply the weight data sequentially read out from the memory cells MC of the memory segment 104 with the input data. For example, the weight data are multiplied with the input data by the multipliers and adders of the LCC 119, to obtain and output the output data. In some embodiments, the input data are serially supplied to the LCC 119 in the form of a stream of bits. In the example configuration in FIG. 1, the input data comprise m bits and the output data also comprise m bits. Other configurations are within the scopes of various embodiments. In at least one embodiment, the input data arc digital signals supplied from the input buffer 128 of the memory controller 120. In at least one embodiment, the input data are output data generated by a computation at a further LCC of another memory segment of the memory device 100. In some embodiments, the output data of the LCC 119 are output by the memory controller 120 to external circuitry outside the memory device 100, for example, a processor. In at least one embodiment, the output data of the LCC 119 are supplied, as input data, to a further LCC of another memory segment of the memory device 100.

In at least one embodiment, a CIM operation is performed at the memory segment 104 simultaneously with, and/or independently from, a further CIM operation performed at another memory segment, e.g., the memory segment 108 along the same global bit lines Global BL0, Global BLB0. Because the global bit lines Global BL0, Global BLB0 are not used in CIM operations, read disturb between the memory segments in their corresponding CIM operations is avoidable, in one or more embodiments.

In some embodiments, the output data generated by CIM operations at different memory segments are further processed separately or independently from each other in further processing following the CIM operations. In some embodiments, the output data generated by CIM operations at different memory segments are related parts of an overall CIM operation, and are combined together in further processing following the CIM operations.

In some embodiments, a CIM operation is performed at a memory segment, e.g., the memory segment 104, simultaneously with, and/or independently from, a read operation (or a write operation) performed at one or more memory cells in another memory segment, e.g., the memory segment 108 along the same global bit lines Global BL0, Global BLB0. This is possible because the CIM operation and the read operation (or write operation) use different bit lines, i.e., the local bit lines for the CIM operation, and the global bit lines for the read operation (or write operation). In at least one embodiment, it is possible to simultaneously update weight bits in one memory segment (by a write operation) and perform a CIM operation in another memory segment, even if the two memory segments are along the same memory column or along the same pair of global bit lines.

Compared to other approaches, the memory device in accordance with some embodiments include simplified circuitry and/or reduced chip area. Specifically, some other approaches selectively couple a local bit line to a global bit line in a read operation, by one or more multiplexers (or switches). To control the one or more multiplexers (or switches), one or more global word lines are required in the other approaches. In contrast, in at least one embodiment, a local bit line is not electrically coupled to a corresponding global bit line in one or more or all of a read operation, a write operation, and a CIM operation. For example, as described herein with respect to some embodiments, the local bit lines Local BL0, Local BLB0 are not electrically coupled to the global bit lines Global BL0, Global BLB0 in a read operation, a write operation, and/or a CIM operation. As a result, multiplexers (or switches) between global bit lines and local bit lines are omitted in one or more embodiments. In at least one embodiment, because multiplexers (or switches) are omitted, global word lines for controlling such multiplexers (or switches) are also omitted. By omitting multiplexers (or switches) and associated with global word lines, one or more embodiments provide a memory device with simplified circuit and reduced chip area. In some embodiments, the omission of global word lines reduces the number of signal lines which, in turn, reduces one or more of signal cross talk, noise, interference, parasitic capacitance, signal delay and/or frees up routing resources (e.g., metal tracks) for other signals.

In some embodiments, for a memory cell in a memory device or IC device, the corresponding local bit line(s) is/are arranged on a first side of the memory device or IC device, whereas the corresponding global bit line(s) is/are arranged on a second side of the memory device or IC device. The second side is opposite the first side in a thickness direction of the memory device or IC device. Because the global bit line(s) and the corresponding local bit line(s) are arranged on opposite sides of the memory device or IC device in the thickness direction, coupling noise in a CIM operation at a memory segment comprising the memory cell is reduced, in one or more embodiments. In at least one embodiment, local bit lines are back side bit lines, whereas global bit lines are front side bit lines. In one or more embodiments, local bit lines are front side bit lines, whereas global bit lines are back side bit lines.

Figure 2:
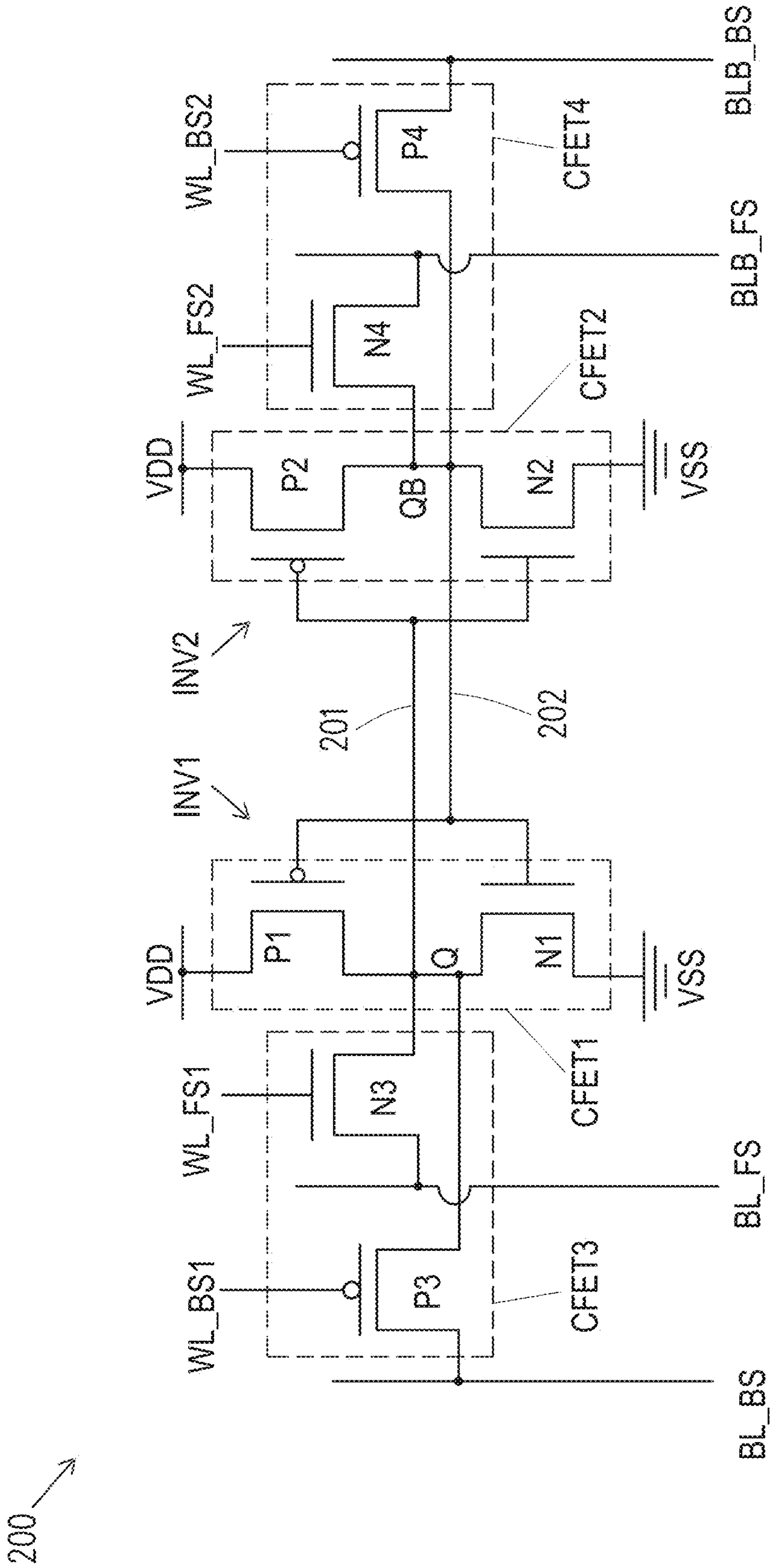
FIG. 2 is a schematic circuit diagram of a memory cell, in accordance with some embodiments.

FIG. 2 is a schematic circuit diagram of a memory cell 200, in accordance with some embodiments. In some embodiments, the memory cell 200 corresponds to one or more of the memory cells in one or more of the memory segments of the memory device 100. In the example configuration in FIG. 2, the memory cell 200 is a SRAM cell comprising eight transistors (8T) and is sometimes referred to as an 8T SRAM cell. Other memory types and/or other SRAM cell configurations, such as 6T SRAM, 10T SRAM, 12T SRAM, or the like, are within the scopes of various embodiments. The memory cell 200 is a dual-port memory cell, as described herein. Other number of ports for a memory cell are within the scopes of various embodiments.

The memory cell 200 comprises a first inverter INV1 comprising a pair of a P-type transistor P1 and an N-type transistor N1, a second inverter INV2 comprising a pair of a P-type transistor P2 and an N-type transistor N2, and access transistors (or pass gate transistors) comprising N-type transistors N3, N4 and P-type transistors P3, P4. Examples of transistors include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. Other transistor configurations are within the scopes of various embodiments.

The inverters INV1, INV2 are cross-coupled to each other to form a latching circuit for data storage. For example, a cross-coupling connection 201 electrically couples an output (node Q) of the first inverter INV1 to an input of the second inverter INV2, and a cross-coupling connection 202 electrically couples an input of the first inverter INV1 to an output (node QB) of the second inverter INV2. In some embodiments, nodes Q, QB in the memory cell 200 correspond to nodes Q, QB in the memory cell 112. The input of the first inverter INV1 is configured by gates of transistor P1 and transistor N1, and the output Q of the first inverter INV1 is configured by electrically coupled first source/drains of transistor P1 and transistor N1. The input of the second inverter INV2 is configured by gates of transistor P2 and transistor N2, and the output QB of the second inverter INV2 is configured by electrically coupled first source/drains of transistor P2 and transistor N2. Second terminals of transistor P1 and transistor P2 are electrically coupled to a power supply VDD, while second terminals of transistor N1 and transistor N2 are electrically coupled to a reference voltage, for example, the ground voltage VSS.

Access to the node Q is controlled by the transistor N3 or the transistor P3. The transistor N3 is electrically coupled between a first front side bit line BL_FS and the node Q. A gate of the transistor N3 is electrically coupled to a first front side word line WL_FS1. The transistor P3 is electrically coupled between a first back side bit line BL_BS and the node Q. A gate of the transistor P3 is electrically coupled to a first back side word line WL_BS1.

The node QB stores a bit of data which is the complement to the bit of data stored at the node Q, e.g., when the node Q is at a logic "high," the node QB is at a logic "low," and vice versa. Access to the node QB is controlled by the transistor N4 or the transistor P4. The transistor N4 is electrically coupled between a second front side bit line BLB_FS and the node QB. A gate of the transistor N4 is electrically coupled to a second front side word line WL_FS2. The transistor P4 is electrically coupled between a second back side bit line BLB_BS and the node QB. A gate of the transistor P4 is electrically coupled to a second back side word line WL_BS2.

In some embodiments, the inverters INV1, INV2 correspond to the data storage circuit 114, each of the transistors N3, N4 corresponds to one of the PG devices 115, 116, and each of the transistors P3, P4 corresponds to one of the PG devices 117, 118.

In an example configuration in accordance with some embodiments, the first front side word line WL_FS1 and second front side word line WL_FS2 are electrically coupled to each other, and correspond to the word line WLA0. The first back side word line WL_BS1 and second back side word line WL_BS2 are electrically coupled to each other, and correspond to the word line WLB0. The first front side bit line BL_FS and second front side bit line BLB_FS configure a pair of differential bit lines, and correspond to the global bit lines Global BL0, Global BLB0. The first back side bit line BL_BS and second back side bit line BLB_BS configure a pair of differential bit lines, and correspond to the local bit lines Local BL0, Local BLB0. The transistors N3, N4 correspond to a first port of the memory cell 200, and are configured for at least one of a read operation or a write operation, using global bit lines configured by the first front side bit line BL_FS and second front side bit line BLB_FS. The transistors P3, P4 correspond to a second port of the memory cell 200, and are configured for a CIM operation, using local bit lines configured by first back side bit line BL_BS and second back side bit line BLB_BS.

In a further example configuration, the first front side word line WL_FS1 and second front side word line WL_FS2 are electrically coupled to each other and correspond to the word line WLB0. The first back side word line WL_BS1 and second back side word line WL_BS2 are electrically coupled to each other and correspond to the word line WLA0. The first front side bit line BL_FS and second front side bit line BLB_FS configure a pair of differential bit lines and correspond to the local bit lines Local BL0, Local BLB0. The first back side bit line BL_BS and second back side bit line BLB_BS configure a pair of differential bit lines and correspond to the global bit lines Global BL0, Global BLB0. The transistors P3, P4 correspond to a first port of the memory cell 200, and are configured for at least one of a read operation or a write operation, using global bit lines configured by the first back side bit line BL_BS and second back side bit line BLB_BS. The transistors N3, N4 correspond to a second port of the memory cell 200, and are configured for a CIM operation, using local bit lines configured by first front side bit line BL_FS and second front side bit line BLB_FS.

In at least one embodiment as described herein, transistor P1 and transistor N1 are configured by a first CFET device CFET1, transistor P2 and transistor N2 are configured by a second CFET device CFET2, transistor P3 and transistor N3 are configured by a third CFET device CFET3, and transistor P4 and transistor N4 are configured by a fourth CFET device CFET4. In the example configuration in FIG. 2, the N-type transistors are electrically coupled to front side word lines and bit lines, whereas the P-type transistors are electrically coupled to back side word lines and bit lines. This configuration, in one or more embodiments, corresponds to an N-on-P structure of CFET devices in which top semiconductor devices are N-type semiconductor devices and bottom semiconductor devices are P-type semiconductor devices. A configuration corresponding to a reversed, P-on-N structure in accordance with some embodiments is described with respect to FIGS. 5A-5B. In at least one embodiment, one or more advantages described herein are achievable by a memory device comprising one or more memory cells 200.

Figure 3A:
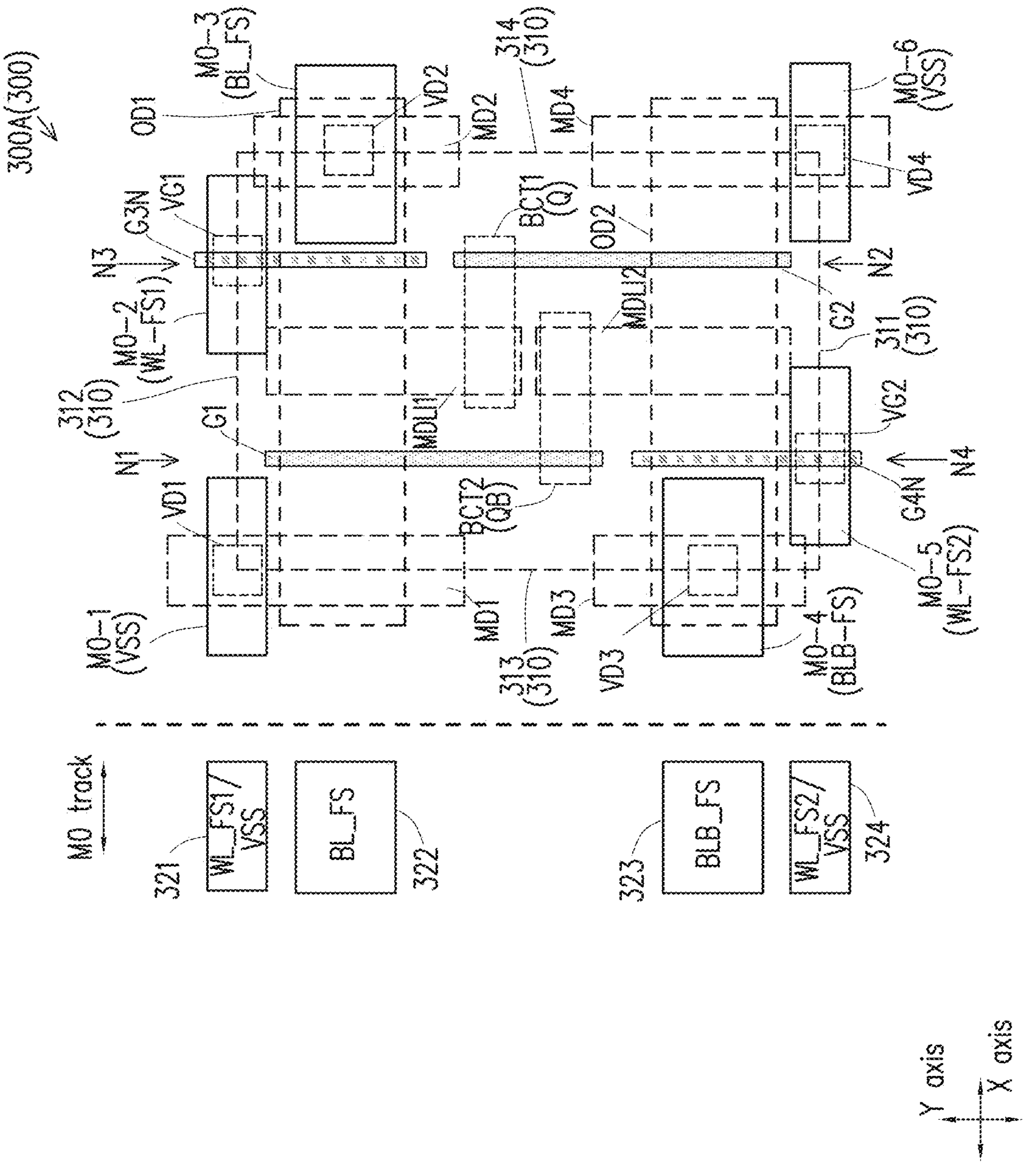
FIGS. 3A and 3B are correspondingly schematic views at a top layer and a bottom layer of a layout diagram of a memory cell.
Figure 3B:
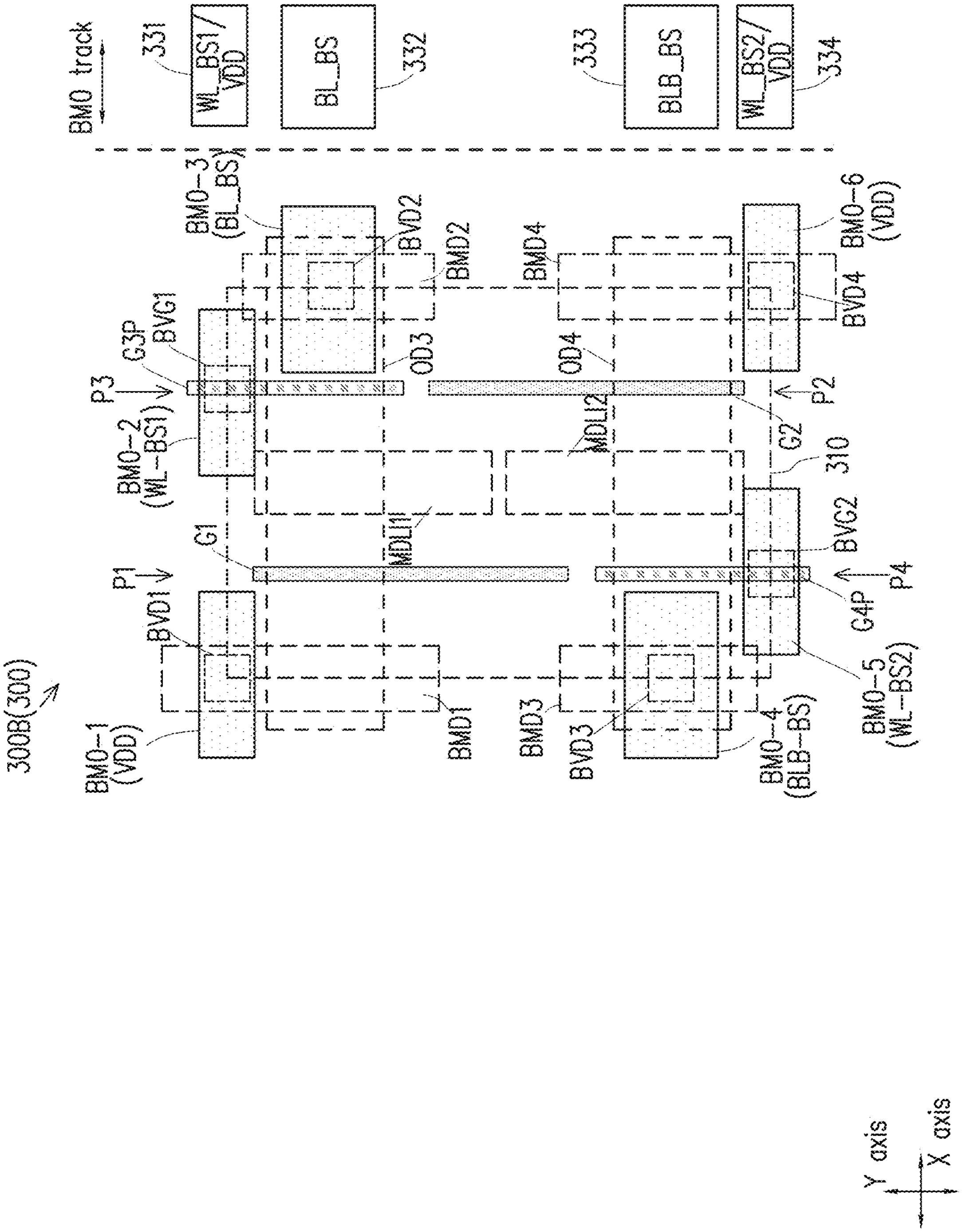
Figure 3C:
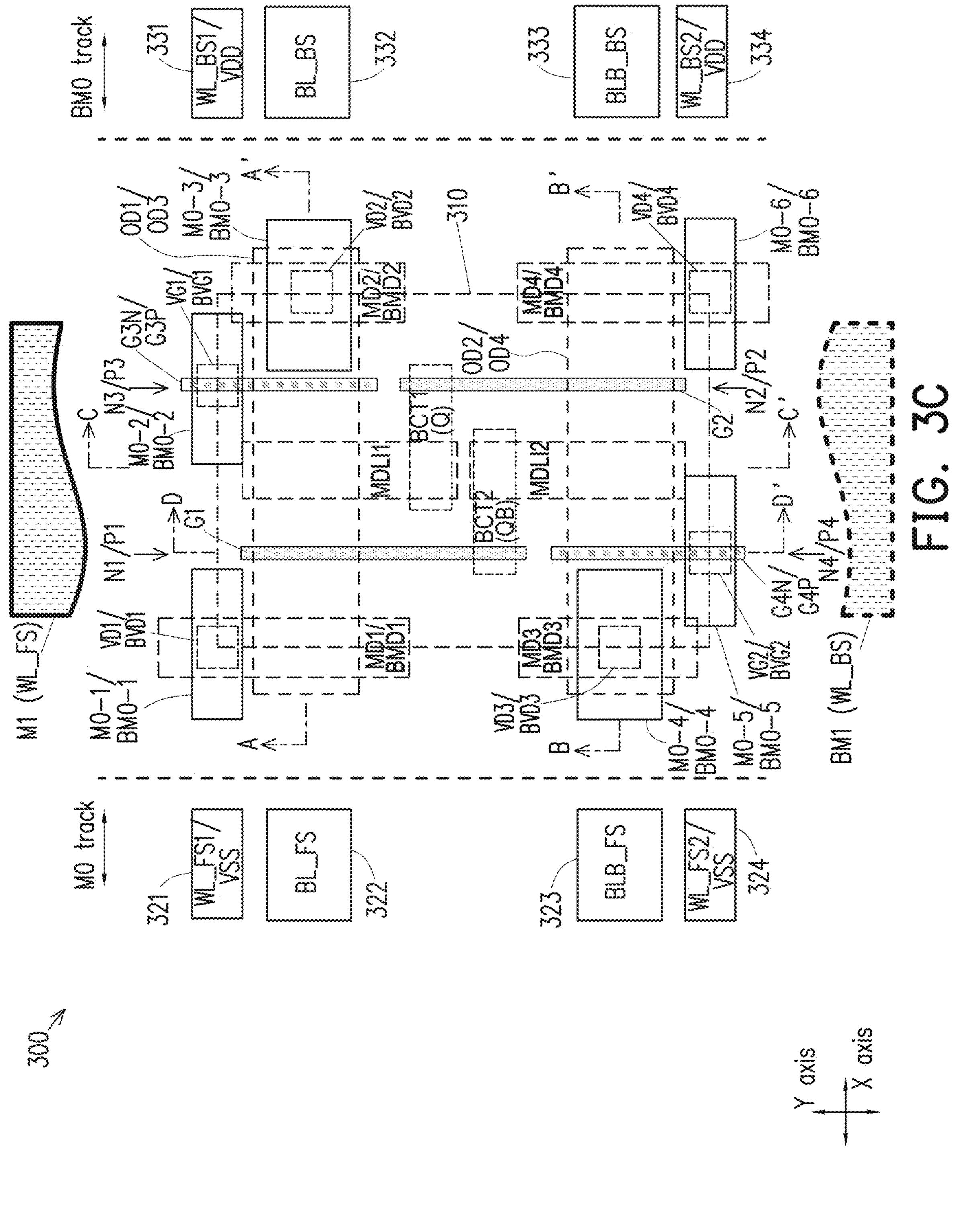
FIG. 3C is a schematic view of the layout diagram of the memory cell, in accordance with some embodiments.

FIGS. 3A and 3B are correspondingly schematic views at a top layer 300A and a bottom layer 300B of a layout diagram of a memory cell 300, and FIG. 3C is a schematic view of the layout diagram of the memory cell 300, in accordance with some embodiments. In some embodiments, the memory cell 300 corresponds to the memory cell 200, and/or to one or more of the memory cells in one or more of the memory segments of the memory device 100. In some embodiments, the layout diagram of the memory cell 300 is stored in a cell library and/or on a non-transitory computer readable recording medium.

In the example configuration in FIGS. 3A-3C, the memory cell 300 comprises CFET devices each comprising a top semiconductor device and a bottom semiconductor device. The top layer 300A (FIG. 3A) corresponds to top semiconductor devices, and the bottom layer 300B (FIG. 3B) corresponds to bottom semiconductor devices. The layout diagram in FIG. 3C is a combination of the top layer 300A stacked on the bottom layer 300B.

Referring to FIGS. 3A-3C, the memory cell 300 comprises a boundary 310 which is the same for both the top layer 300A, and the bottom layer 300B. The boundary 310 comprises edges 311, 312, 313, 314. The edges 311, 312 are elongated along an X axis, and the edges 313, 314 are elongated along a Y axis transverse to the X axis. The edges 311, 312, 313, 314 are connected together to form the closed boundary 310. In a place-and-route operation (also referred to as "automated placement and routing (APR)") described herein, cells are placed in an IC layout diagram in abutment with each other at their respective boundaries. The boundary 310 is sometimes referred to as "place-and-route boundary" or "prBoundary." The rectangular shape of the boundary 310 is an example. Other boundary shapes for various cells are within the scope of various embodiments. The memory cell 300 is within the boundary 310.

The top layer 300A comprises a layout of top semiconductor devices of a first type, and the bottom layer 300B comprises a layout of corresponding bottom semiconductor devices of a second type different from the first type. In some embodiments, the first type is one of a P-type and an N-type, and the second type is the other of the P-type and N-type. In the example configuration in FIGS. 3A-3C, the top layer 300A comprises N-type transistors, such as NMOSs, and the bottom layer 300B comprises P-type transistors, such as PMOSs. Such a configuration corresponds to an N-on-P structure, as described herein.

Each of the top layer 300A and bottom layer 300B comprises at least one active region. Active regions are sometimes referred to as oxide-definition (OD) regions or source/drain regions, and are schematically illustrated in the drawings with labels including "OD." For example, the top layer 300A comprises active regions OD1, OD2, and the bottom layer 300B comprises active regions OD3, OD4. In the layout diagram in FIG. 3C, the active regions OD1 and OD3 overlap each other, or are stacked one over another, along a thickness direction of a substrate as described herein. Similarly, the active regions OD2 and OD4 overlap each other, or are stacked one over another, along the thickness direction of the substrate.

The active regions OD1, OD2, OD3, OD4 are over a first side, or a front side, of the substrate as described herein. The active regions OD1, OD2, OD3, OD4 are elongated along the X axis. The active regions OD1, OD2, OD3, OD4 include P-type dopants or N-type dopants to form one or more circuit elements or semiconductor devices. An active region configured to form one or more PMOS devices is sometimes referred to as "PMOS active region," and an active region configured to form one or more NMOS devices is sometimes referred to as "NMOS active region." In the example configuration described with respect to FIGS. 3A-3C, the active regions OD1, OD2 comprise NMOS active regions, and the active regions OD3, OD4 comprise PMOS active regions.

The top layer 300A further comprises a plurality of gate regions G1, G2, G3N, G4N which overlap, or are stacked along the thickness direction of the substrate over, corresponding gate regions in the bottom layer 300B. Each of the gate regions G1, G2 in the top layer 300A is further electrically coupled to the corresponding, underlying gate region in the bottom layer 300B. For simplicity, the gate regions in the bottom layer 300B, underlying and electrically coupled to the gate regions G1, G2 in the top layer 300A, are correspondingly designated by the same reference numerals G1, G2. The gate regions G3N, G4N in the top layer 300A are electrically isolated from the corresponding, underlying gate regions G3P, G4P in the bottom layer 300B. The gate regions G1-G4 are elongated along the Y axis. The gate regions G1-G4 comprise a conductive material, such as, polysilicon, metals, or the like.

The top layer 300A further comprises a plurality of top semiconductor devices configured by the gate regions G1, G2, G3N, G4N and the active regions OD1, OD2. Specifically, the gate region G1 and the active region OD1 configure an NMOS corresponding to transistor N1, the gate region G2 and the active region OD2 configure an NMOS corresponding to transistor N2, the gate region G3N and the active region OD1 configure an NMOS corresponding to transistor N3, and the gate region G4N and the active region OD2 configure an NMOS corresponding to transistor N4.

The bottom layer 300B further comprises a plurality of bottom semiconductor devices configured by the gate regions G1, G2, G3P, G4P and the active regions OD3, OD4. Specifically, the gate region G1 and the active region OD3 configure a PMOS corresponding to transistor P1, the gate region G2 and the active region OD4 configure a PMOS corresponding to transistor P2, the gate region G3P and the active region OD3 configure a PMOS corresponding to transistor P3, and the gate region G4P and the active region OD4 configure a PMOS corresponding to transistor P4.

The transistor N1 and the underlying transistor P1 configure a CFET device corresponding to the device CFET1. The transistor N2 and the underlying transistor P2 configure a CFET device corresponding to the device CFET2. The transistor N3 and the underlying transistor P3 configure a CFET device corresponding to the device CFET3. The transistor N4 and the underlying transistor P4 configure a CFET device corresponding to the device CFET4.

The memory cell 300 further comprises source/drain contacts over and in electrical contact with corresponding source/drains in the active regions OD1, OD2, OD3, OD4. Source/drain contacts are sometimes referred to as metal-to-device (MD) contacts, and are schematically designated in the drawings with labels including "MD." Source/drain contacts of top semiconductor devices at the top layer 300A are sometimes referred to as MD contacts. Source/drain contacts of bottom semiconductor devices at the bottom layer 300B are sometimes referred to as BMD contacts. For simplicity, an MD contact herein refers to either an MD contact at the top layer or a BMD contact at the bottom layer, unless specified otherwise. An MD contact includes a conductive material over a corresponding source/drain in the corresponding active region to define an electrical connection from one or more devices formed in the active region to other internal circuitry of a memory device, an IC device including the memory device, or to outside circuitry. MD contacts are arranged alternatingly with the gate regions along the X axis. At the top layer 300A in FIG. 3A, each of MD contacts MD1-MD4 is on a corresponding source/drain of one of transistors N1, N3, N4, N2. At the bottom layer 300B in FIG. 3B, each of BMD contacts BMD1-BMD4 is on a corresponding source/drain of one of transistors P1, P3, P4, P2. The MD contacts MD1-MD4 correspondingly overlap, but are electrically isolated from, the BMD contacts BMD1-BMD4.

The memory cell 300 further comprises source/drain local interconnects (MDLIs). An interconnect MDLI is a conductive structure electrically coupling an MD contact with a underlying BMD contact. In the example configuration in FIGS. 3A-3C, each interconnect MDLI replaces the corresponding MD contact and BMD contact, and is in physical and electrical contact with both a source/drain in the top layer 300A and a underlying source/drain in the bottom layer 300B. Specifically, the memory cell 300 comprises interconnect MDLI1 electrically coupling a common source/drain of transistor N1 and transistor N3 at the top layer 300A to a underlying common source/drain of transistor P1 and transistor P3 at the bottom layer 300B. The memory cell 300 further comprises interconnect MDLI2 electrically coupling a common source/drain of transistor N2 and transistor N4 at the top layer 300A to a common source/drain of transistor P2 and transistor P4 at the bottom layer 300B.

The memory cell 300 further comprises bridge interconnects (BCTs). An interconnect BCT is a conductive structure electrically coupling an interconnect MDLI with an adjacent gate region. Specifically, the memory cell 300 comprises interconnect BCT1 electrically coupling the gate region G2 to the interconnect MDLI1, and interconnect BCT2 electrically coupling the gate region G1 to the interconnect MDLI2. The interconnects MDLI1, BCT1 correspond to the node Q, and the interconnects MDLI2, BCT2 correspond to the node QB. In the example configuration in FIG. 3A, the interconnects BCT1, BCT2 are included in the top layer 300A. In some embodiments, at least one of the interconnects BCT1, BCT2 is included in the bottom layer 300B.

The top layer 300A further comprises vias over and in electrical contact with gate regions and MD contacts. A via over and in electrical contact with an MD contact is sometimes referred to as via-to-device (VD) via. A via over and in electrical contact with a gate is sometimes referred to as via-to-gate (VG) via. VD and VG vias are schematically illustrated in the drawings with the corresponding labels including "VD" and "VG." In the example configuration in FIG. 3A, vias VG1, VG2 are correspondingly over the gate regions G3N, G4N, and vias VD1-VD4 are correspondingly over MD contacts MD1-MD4.

Similarly, the bottom layer 300B comprises back side VD vias and back side VG vias in electrical contact with corresponding BMD contacts and/or gate regions. Back side VD vias and back side VG vias are schematically illustrated in the drawings with the corresponding labels including "BVD" and "BVG." In the example configuration in FIG. 3B, vias BVG1, BVG2 are correspondingly under the gate regions G3P, G4P, and vias BVD1-BVD4 are correspondingly under BMD contacts BMD1-BMD4. An example material of VD, VG, BVD, BVG vias includes metal. Other configurations are within the scopes of various embodiments.

The top layer 300A further comprises a plurality of metal layers and via layers sequentially and alternatingly arranged over the VD, VG vias. The lowermost metal layer immediately over and in electrical contact with the VD, VG vias is an M0 (metal-zero) layer, a next metal layer immediately over the M0 layer is an M1 layer, a next metal layer immediately over the M1 layer is an M2 layer, or the like. Conductive patterns in the M0 layer are referred to as M0 conductive patterns, conductive patterns in the M1 layer are referred to as M1 conductive patterns, or the like. A via layer Vn is arranged between and electrically couple the Mn layer and the Mn+1 layer, where n is an integer from zero and up. For example, a via-zero (V0) layer is the lowermost via layer which is arranged between and electrically couple the M0 layer and the M1 layer. Other via layers are V1, V2, or the like. Vias in the V0 layer are referred to as V0 vias, vias in the V1 layer are referred to as V1 vias, or the like.

Similarly, the bottom layer 300B comprises a plurality of back side metal layers and a plurality of back side via layers arranged sequentially and alternatingly under the BVD, BVG vias. The back side metal layer closest to the front side (or to the active regions OD3, OD4) is a back side M0 (BM0) layer, a next back side metal layer is a back side M1 (BM1) layer, or the like. A back side via layer BVn is arranged between and electrically couples the BMn layer and the BMn+1 layer, where n is an integer from zero and up. For example, a via layer BV0 is the back side via layer arranged between and electrically couples the BM0 layer and the BM1 layer. Other back side via layers are BV1, BV2, or the like.

In the example configuration in FIG. 3A, the top layer 300A comprises M0 conductive patterns M0-1 to M0-6 correspondingly over vias VD1, VG1, VD2, VD3, VG2, VD4. The M0 conductive patterns M0-1, M0-6 are configured to be electrically coupled to one or more VSS power rails.

The M0 conductive patterns M0-2 and M0-5 correspond to the first front side word line WL_FS1 and second front side word line WL_FS2, and are configured to be electrically coupled to a front side word line WL_FS in the M1 layer, as described with respect to FIG. 3C. Accordingly, the M0 conductive patterns M0-2 and M0-5 (or the first front side word line WL_FS1 and second front side word line WL_FS2) are physically spaced from, and electrically coupled to, each other.

The M0 conductive patterns M0-3 and M0-4 correspond to the first front side bit line BL_FS and second front side bit line BLB_FS. In some embodiments, at least one of the M0 conductive patterns M0-3 and M0-4 is elongated along the X axis (corresponding to the C axis) across multiple memory cells in a memory column, and configures a front side bit line in the M0 layer, e.g., as described with respect to FIG. 4F. In at least one embodiment, at least one of the M0 conductive patterns M0-3 and M0-4 is electrically coupled by a V0 via, an M1 conductive pattern and a V1 via, to an M2 conductive pattern that is elongated along the X axis across multiple memory cells in a memory column and configures a front side bit line in the M2 layer, e.g., as described with respect to FIG. 4G.

FIG. 3A further shows usage of M0 tracks 321-324 in the top layer 300A. The M0 track 321 is configured for VSS and a front side word line, and M0 conductive pattern M0-1 for VSS and M0 conductive pattern M0-2 for the first front side word line WL_FS1 are arranged along the M0 track 321. The M0 track 322 is configured for a front side bit line, and M0 conductive pattern M0-3 for the first front side bit line BL_FS is arranged along the M0 track 322. The M0 track 323 is configured for another front side bit line, and M0 conductive pattern M0-4 for the second front side bit line BLB_FS is arranged along the M0 track 323. The M0 track 324 is configured for VSS and the front side word line, and M0 conductive pattern M0-6 for VSS and M0 conductive pattern M0-5 for the second front side word line WL_FS2 are arranged along the M0 track 324.

In the example configuration in FIG. 3B, the bottom layer 300B comprises BM0 conductive patterns BM0-1 to BM0-6 correspondingly under vias BVD1, BVG1, BVD2, BVD3, BVG2, BVD4. The BM0 conductive patterns BM0-1, BM0-6 are configured to be electrically coupled to one or more VDD power rails.

The BM0 conductive patterns BM0-2 and BM0-5 correspond to the first back side word line WL_BS1 and second back side word line WL_BS2, and are configured to be electrically coupled to a back side word line WL_BS in the BM1 layer, as described with respect to FIG. 3C. Accordingly, the BM0 conductive patterns BM0-2 and BM0-5 (or the first back side word line WL_BS1 and second back side word line WL_BS2) are physically spaced from, and electrically coupled to, each other.

The BM0 conductive patterns BM0-3 and BM0-4 correspond to the first back side bit line BL_BS and second back side bit line BLB_BS. In some embodiments, at least one of the BM0 conductive patterns BM0-3 and BM0-4 is elongated along the X axis (corresponding to the C axis) across multiple memory cells in a memory column, and configures a back side bit line in the BM0 layer, e.g., as described with respect to FIG. 4F. In at least one embodiment, at least one of the BM0 conductive patterns BM0-3 and BM0-4 is electrically coupled by a BV0 via, a BM1 conductive pattern and a BV1 via, to a BM2 conductive pattern that is elongated along the X axis across multiple memory cells in a memory column and configures a back side bit line in the BM2 layer, e.g., as described with respect to FIG. 4G.

FIG. 3B further shows usage of BM0 tracks 331-334 in the bottom layer 300B. The BM0 track 331 is configured for VDD and a back side word line, and BM0 conductive pattern BM0-1 for VDD and BM0 conductive pattern BM0-2 for the first back side word line WL_BS1 are arranged along the BM0 track 331. The BM0 track 332 is configured for a back side bit line, and BM0 conductive pattern BM0-3 for the first back side bit line BL_BS is arranged along the BM0 track 332. The BM0 track 333 is configured for another back side bit line, and BM0 conductive pattern BM0-4 for the second back side bit line BLB_BS is arranged along the BM0 track 333. The BM0 track 334 is configured for VDD and the back side word line, and BM0 conductive pattern BM0-6 for VDD and BM0 conductive pattern BM0-5 for the second back side word line WL_BS2 are arranged along the BM0 track 334.

In the example configuration in FIGS. 3A-3C, the edge 311 of the boundary 310 is along the M0 track 324, and coincides with centerlines of M0 conductive patterns M0-5, M0-6. The edge 312 of the boundary 310 is along the M0 track 321, and coincides with centerlines of M0 conductive patterns M0-1, M0-2. The edge 313 of the boundary 310 coincides with centerlines of MD contacts MD1, MD3 and BMD contacts BMD1, BMD3. The edge 314 of the boundary 310 coincides with centerlines of MD contacts MD2, MD4 and BMD contact BMD2, BMD4.

As illustrated in FIG. 3C, the MD contacts MD1-MD4 correspondingly overlap the BMD contacts BMD1-BMD4, the vias VD1, VG1, VD2, VD3, VG2, VD4 correspondingly overlap the vias BVD1, BVG1, BVD2, BVD3, BVG2, BVD4, and the M0 conductive patterns M0-1 to M0-6 correspondingly overlap the BM0 conductive patterns BM0-1 to BM0-6 along the thickness direction (i.e., Z axis). In addition to various components described with respect to FIGS. 3A, 3B, the memory cell 300 further comprises the front side word line WL_FS configured in the M1 layer, and the back side word line WL_BS configured in the BM1 layer. Each of the front side word line WL_FS and the back side word line WL_BS comprises an M1 or BM1 conductive pattern which extends continuously along the Y axis over at least a whole height of the memory cell 300 in the Y axis. For simplicity, a portion of the front side word line WL_FS and a portion of the back side word line WL_BS overlapping the memory cell 300 are not illustrated. Although not illustrated in FIG. 3C, each of the front side word line WL_FS and the back side word line WL_BS further extends continuously over other memory cells placed along the Y axis in abutment with each other or in abutment with the memory cell 300 to form a memory row. In the example configuration in FIG. 3C, the Y axis corresponds to the R axis described with respect to FIG. 1A.

The memory cell 300 further comprises two V0 vias (not shown) correspondingly over the M0 conductive patterns M0-2, M0-5 to electrically couple the front side word line WL_FS to the M0 conductive patterns M0-2, M0-5, then to the vias VG1, VG2, then to the gate regions G3N, G4N of the transistors N3, N4.

The memory cell 300 further comprises two BV0 vias (not shown) correspondingly under the BM0 conductive patterns BM0-2, BM0-5 to electrically couple the back side word line WL_BS to the BM0 conductive patterns BM0-2, BM0-5, then to the vias BVG1, BVG2, then to the gate regions G3P, G4P of the transistors P3, P4.

The memory cell 300 is an example of a memory cell electrically coupled to both front side and back side word lines, and also to both front side and back side bit lines. In at least one embodiment, one or more advantages described herein are achievable by a memory device comprising one or more memory cells 300.

FIGS. 4A-4D are schematic cross-sectional views of a portion of a memory device 400, in accordance with some embodiments. The portion of the memory device 400 in FIGS. 4A-4D corresponds to the memory cell 300, the memory cell 200, and/or one or more memory cells in the memory device 100. The views in FIGS. 4A and 4B correspond to X axis cross-sectional views taken along lines A-A' and B-B' in FIG. 3C. The views in FIGS. 4C and 4D correspond to Y axis cross-sectional views taken along lines C-C' and D-D' in FIG. 3C. For simplicity, corresponding components in FIGS. 3A-3C and 4A-4D are designated by the same reference numerals.

Figure 4A:
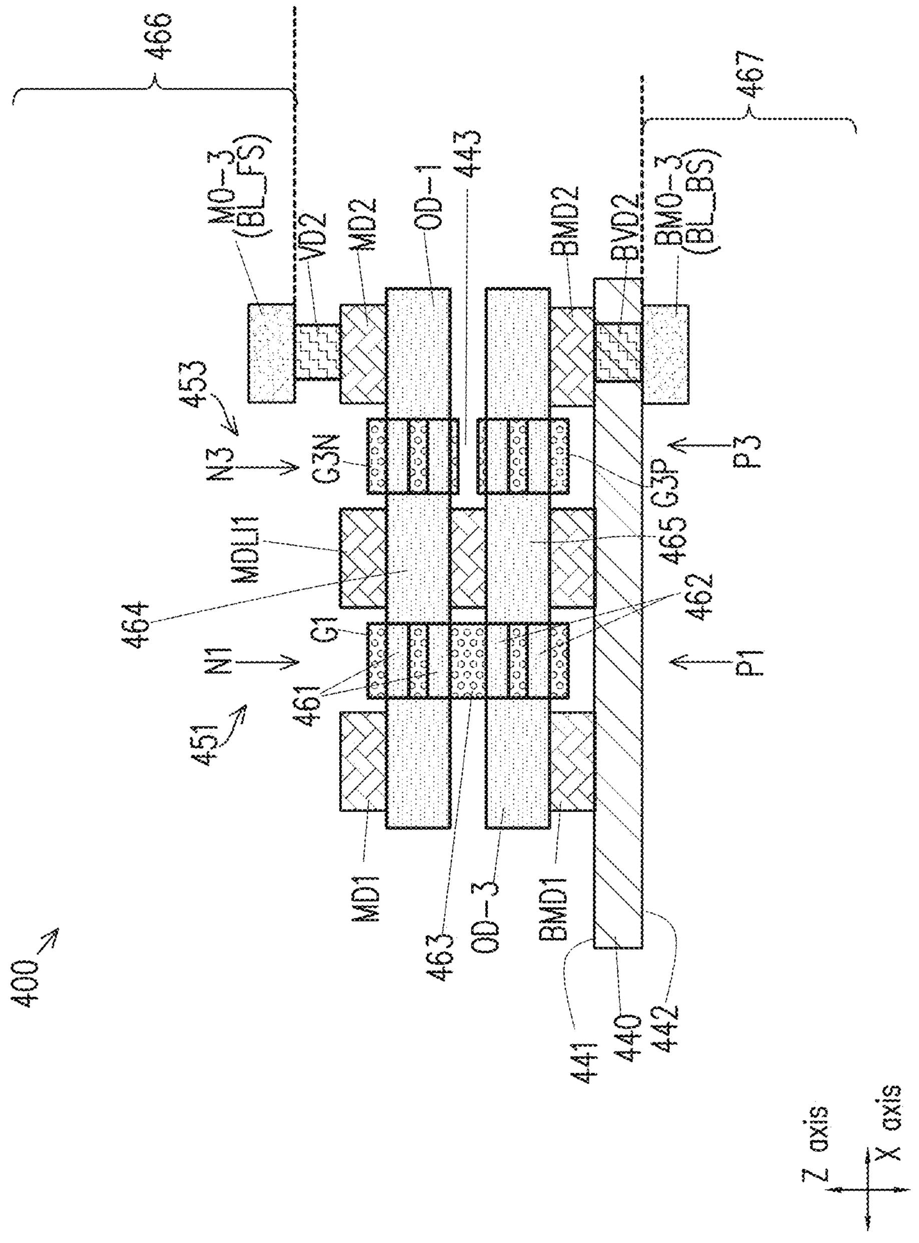
FIGS. 4A-4G are schematic cross-sectional views of various portions of one or more memory devices, in accordance with some embodiments.

As illustrated in FIG. 4A, the memory device 400 comprises a substrate 440 having a front side 441, and a back side 442 opposite to the front side 441 in a thickness direction of the substrate 440. In at least one embodiment, the front side 441 is referred to as "first side," "upper side" or "device side," whereas the back side 442 is referred to as "second side," or "lower side." The thickness direction of the substrate 440 is also a thickness direction of the memory device 400, and is designated as Z axis in the drawings. In some embodiments, the substrate 440 comprises a semiconductor material, such as silicon, silicon germanium (SiGe), gallium arsenic, or other suitable semiconductor materials. In some embodiments, the substrate 440 comprises a dielectric material, such as silicon nitride, silicon oxide, ceramic, glass, or other suitable materials. In some embodiments, the substrate 440 comprises a multi-layer structure. In some embodiments, the substrate 440 is omitted, or comprises an insulation layer that replaces an initial semiconductor bulk used during manufacture. For simplicity, the substrate 440 is omitted in FIGS. 4B-4D.

Figure 4B:
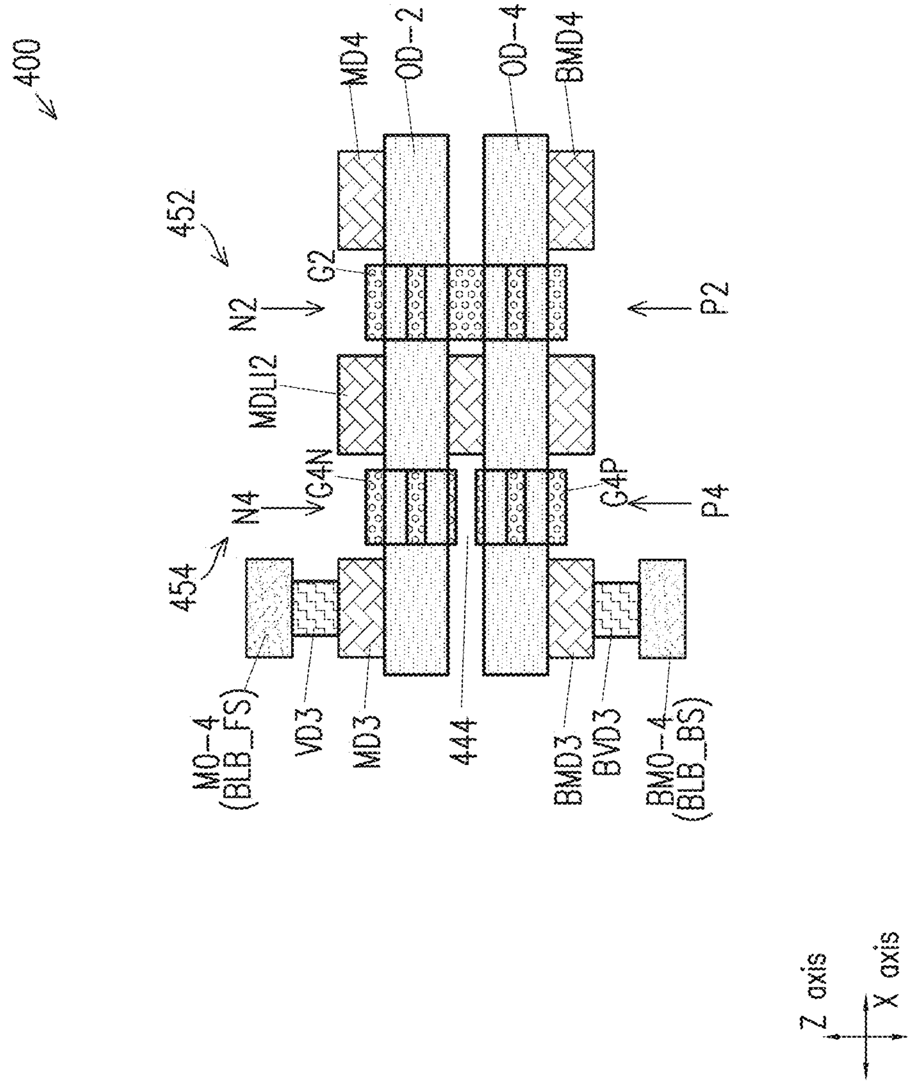

The memory device 400 further comprises CFET devices 451-454 over the front side 441 of the substrate 440. The CFET devices 451-454 correspond to the devices CFET1-CFET4. The CFET devices 451, 453 are illustrated in FIG. 4A, and the CFET devices 452, 454 are illustrated in FIG. 4B. The CFET device 451 comprises transistor N1 as a top semiconductor device over transistor P1 as a bottom semiconductor device, CFET device 452 comprises transistor N2 as a top semiconductor device over transistor P2 as a bottom semiconductor device, CFET device 453 comprises transistor N3 as a top semiconductor device over transistor P3 as a bottom semiconductor device, and the CFET device 454 comprises transistor N4 as a top semiconductor device over transistor P4 as a bottom semiconductor device. The top semiconductor devices, i.e., transistors N1-N4 are examples of semiconductor devices in an upper layer of the memory device 400, and the bottom semiconductor devices, i.e., transistors P1-P4 are examples of semiconductor devices in a lower layer of the memory device 400.

Each top semiconductor device or bottom semiconductor device comprises a channel which is arranged in a corresponding active region. In the example configuration in FIG. 4A, the channel of transistor N1 comprises a semiconductor material, such as Si, in the corresponding active region OD1, and is configured as a plurality of N-type nanosheets 461 stacked over, while being spaced from, each other in the thickness direction. Similarly, the channel of transistor P1 comprises a semiconductor material, such as Si, in the corresponding active region OD3, and is configured as a plurality of P-type nanosheets 462 stacked over, while being spaced from, each other in the thickness direction. The described channel material and nanosheets are examples. Other channel materials and/or channel types, such as nanowire, FinFET, planar, or the like, are within the scopes of various embodiments.

Each top semiconductor device or bottom semiconductor device further comprises a gate corresponding to one of the gate regions G1, G2, G3N, G3P, G4N, G4P. For simplicity, the gates in the memory device 400 are referred to by the same reference numerals of the corresponding gate regions in the memory cell 300. In some embodiments, the gates G1, G2, G3N, G3P, G4N, G4P are metal gates. Other gate materials, such a polysilicon, are within the scopes of various embodiments. In the example configuration in FIGS. 4A-4B, the gates G1, G2, G3N, G3P, G4N, G4P are all-around gates which extend around the corresponding channels. In some embodiments, the gate material of the gates G1, G2, G3N, G3P, G4N, G4P replaces a sacrificial material, such as SiGe, in the corresponding active region during a manufacturing process.

In the CFET device 451, the gate of transistor N1 is electrically coupled to the gate of transistor P1 by a local interconnect 463. In some embodiments, the local interconnect 463 is formed as an integral part of the gate G1 around the nanosheets 461, 462. Similarly, in the CFET device 452, the gate of transistor N2 is electrically coupled to the gate of transistor P2 by a local interconnect (not numbered) which, in some embodiments, is formed as an integral part of the gate G2 around the corresponding nanosheets (not numbered). Because the gate of transistor N1 is electrically coupled to the gate of transistor P1, the gates of transistors N1, P1 are commonly designated by the same reference numeral G1. Likewise, the gates of transistors N2, P2 are commonly designated by the same reference numeral G2. The gate configuration of the CFET devices 451, 452 is sometimes referred to as an interconnected gate configuration.

Compared to the CFET devices 451, 452 which include the interconnected gate configuration, the CFET devices 453, 454 include an isolated gate configuration in which the gate of the top semiconductor device is not electrically coupled by a local interconnect to the gate of the underlying bottom semiconductor device. For example, in the CFET device 453, the gate G3N of transistor N3 is physically disconnected and electrically isolated from the gate G3P of transistor P3, e.g., by a spacing or dielectric material 443. Similarly, in the CFET device 454, the gate G4N of transistor N4 is physically disconnected and electrically isolated from the gate G4P of transistor P4, e.g., by a spacing or dielectric material 444.

Each top semiconductor device or bottom semiconductor device further comprises a gate dielectric (not shown) between the corresponding gate and channel. For example, in transistor N1, a gate dielectric is between the gate G1 and nanosheets 461, and extends around each of the nanosheets 461. Example materials of the gate dielectric include high-k dielectric materials, or the like.

Each top semiconductor device or bottom semiconductor device further comprises source/drains in the corresponding active region. For example, transistor N1 and transistor N3 share a common source/drain 464 in the active region OD1, and transistor P1 and transistor P3 share a common source/drain 465 in the active region OD3. In some embodiments, a source/drain comprises an epitaxy structure coupled to the adjacent nanosheets. For example, the source/drain 464 is coupled to the nanosheets 461, and the source/drain 465 is coupled to the nanosheets 462. In some embodiments, source/drains are grown by epitaxy processes.

The memory device 400 further comprises interconnects MDLI1, MDLI2 as described with respect to FIGS. 3A-3C. In the example configurations in FIG. 4A, the interconnect MDLI1 extends around and is electrically coupled to the source/drains 464, 465. The interconnect MDLI2 is similarly configured, as illustrated in FIG. 4B. An example material of interconnect MDLIs comprises a metal.

As can be seen in FIGS. 4A-4B, the memory device 400 further comprises various MD contacts, VD vias, VG vias on the front side, and BMD contacts, BVD vias, BVG vias on the back side, as described with respect to FIGS. 3A-3C. The memory device 400 further comprises a front side redistribution structure 466, and back side redistribution structure 467. The front side redistribution structure 466 is on the front side, over the VD, VG vias, and comprises various metal layers M0, M1, or the like, and via layers V0, V1 or the like, as described herein. The back side redistribution structure 467 is on the back side, under the BVD, BVG vias, and comprises various back side metal layers BM0, BM1, or the like, and back side via layers BV0, BV1 or the like, as described herein. In the example configuration in FIG. 4A, the via BVD2 extends through the substrate 440 from the back side 442 to the front side 441, to come in physical and electrical contact with the BMD contacts BMD2. The BM0 conductive pattern BM0-3 is on the back side 442 of the substrate 440, and is in physical and electrical contact with the via BVD2. For simplicity, various metal layers and via layers in the front side redistribution structure 466 and back side redistribution structure 467 are omitted.

Figure 4E:
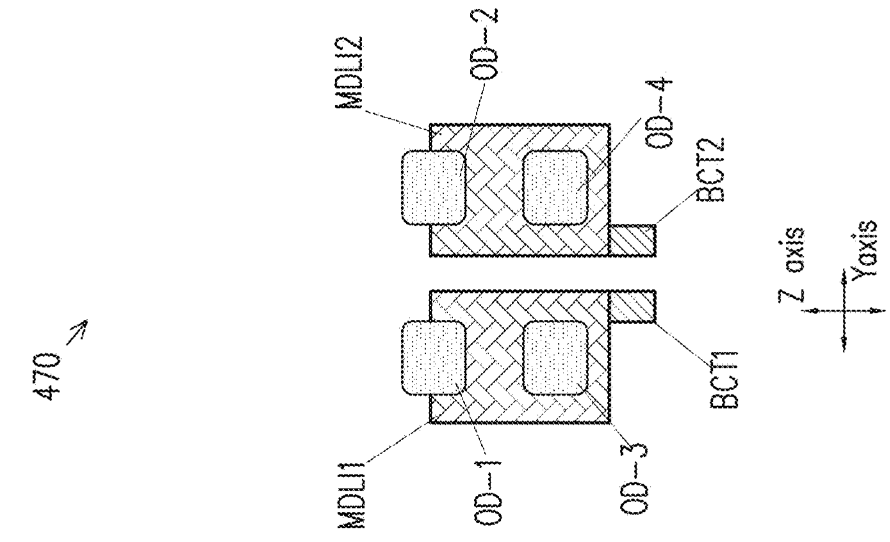
Figure 4D:
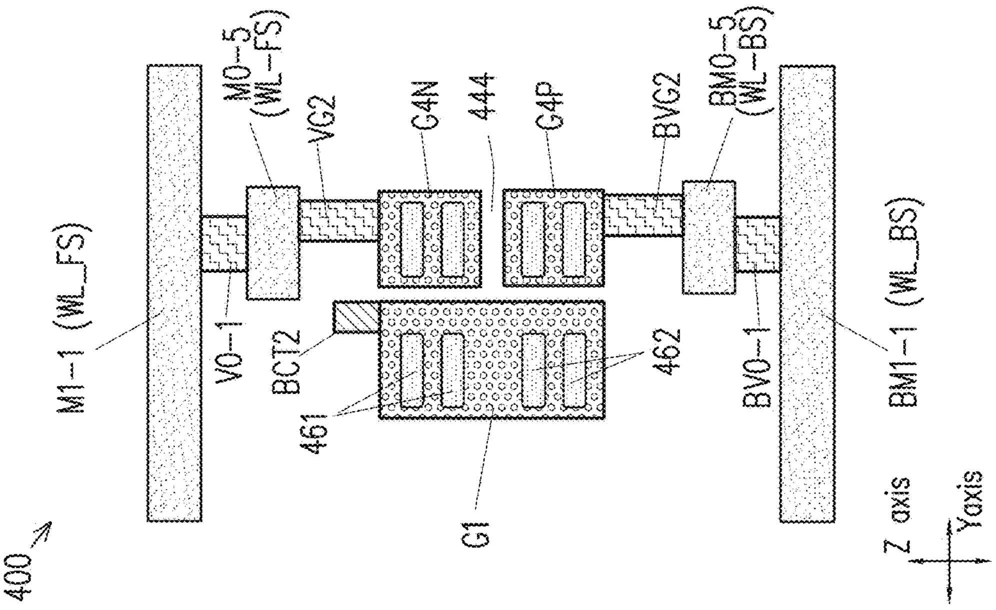
Figure 4C:
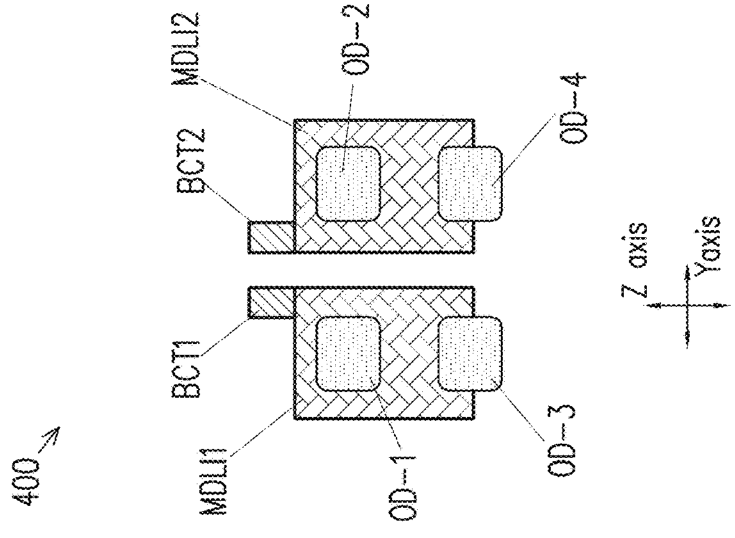

As can be seen in FIG. 4C, the memory device 400 comprises interconnects BCT1, BCT2 correspondingly over the interconnects MDLI1, MDLI2.

As can be seen in FIG. 4D, the interconnect BCT2 is also over the gate G1. Thus, the interconnects BCT2 electrically couples the gate G1 to the interconnect MDLI2. Similarly although not illustrated, the interconnects BCT1 electrically couples the gate G2 to the interconnect MDLI1.

In FIG. 4D, a via BVG2 extends through the substrate 440 (not shown in FIG. 4D) in a manner similar to the via BVD2, and electrically couples the gate G4P on the front side 441 with BM0 conductive pattern BM0-5 on the back side 442. A via BV0-1 is under and electrically couples the BM0 conductive pattern BM0-5 to a underlying BM1 conductive pattern BM1-1. The BM1 conductive pattern BM1-1 extends continuously along the Y axis across multiple memory cells, and configures the back side word line WL_BS, as described with respect to FIG. 3C.

Similarly, a via VG2 electrically couples the gate G4N with M0 conductive pattern M0-5. A via V0-1 is over and electrically couples the M0 conductive pattern M0-5 to an overlying M1 conductive pattern M1-1. The M1 conductive pattern M1-1 extends continuously along the Y axis across multiple memory cells, and configures the front side word line WL_FS, as described with respect to FIG. 3C. In some embodiments, at least one of the front side word line WL_FS or back side word line WL_BS is correspondingly configured in the M3 or BM3 layer, instead of the M1 or BM1 layer as described with respect to FIG. 4D. In at least one embodiment, one or more advantages described herein are achievable by the memory device 400.

FIG. 4E is a schematic cross-sectional view of a portion of a memory device 470, in accordance with some embodiments. FIG. 4E is a Y axis cross-sectional view similar to FIG. 4C, and shows an alternative configuration of the interconnects BCT1, BCT2. In FIG. 4E, the interconnects BCT1, BCT2 are under the corresponding interconnects MDLI1, MDLI2. Other aspects or features of the memory device 470 are similar to the memory device 400. In at least one embodiment, one of the interconnects BCT1, BCT2 is over the corresponding interconnect MDLI1 or MDLI2, whereas the other of the interconnects BCT1, BCT2 is under the corresponding interconnect MDLI1 or MDLI2. In at least one embodiment, one or more advantages described herein are achievable by the memory device 470.

Figure 4F:
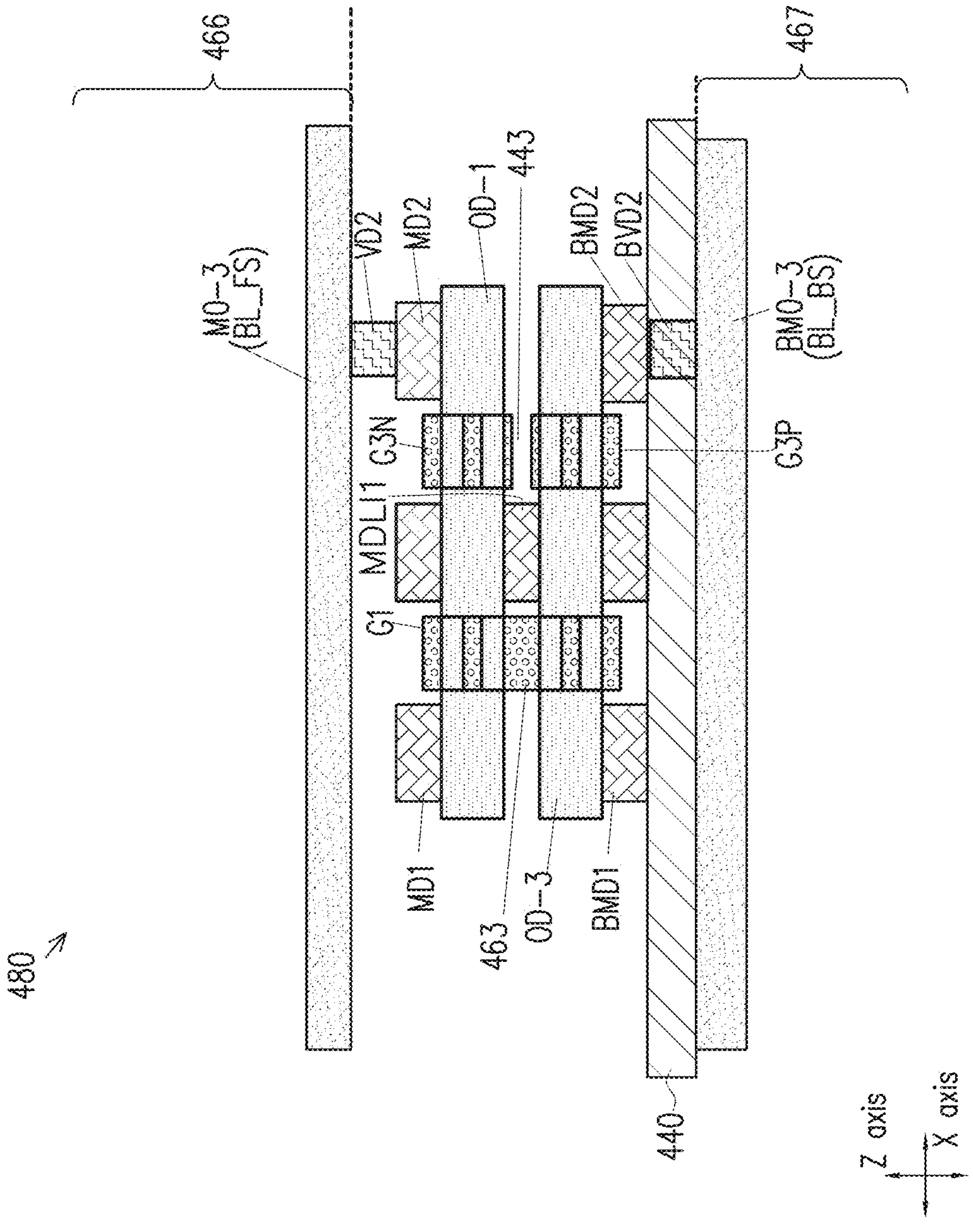

FIG. 4F is a schematic cross-sectional view of a portion of a memory device 480, in accordance with some embodiments. FIG. 4F is an X axis cross-sectional view similar to FIG. 4A, and shows a configuration in which each of the M0 conductive pattern M0-3 and BM0 conductive pattern BM0-3 extend continuously along the X axis across multiple memory cells in a memory column, and correspondingly configures a front side bit line in the M0 layer, or a back side bit line in the BM0 layer. In at least one embodiment, one or more advantages described herein are achievable by the memory device 480.

Figure 4G:
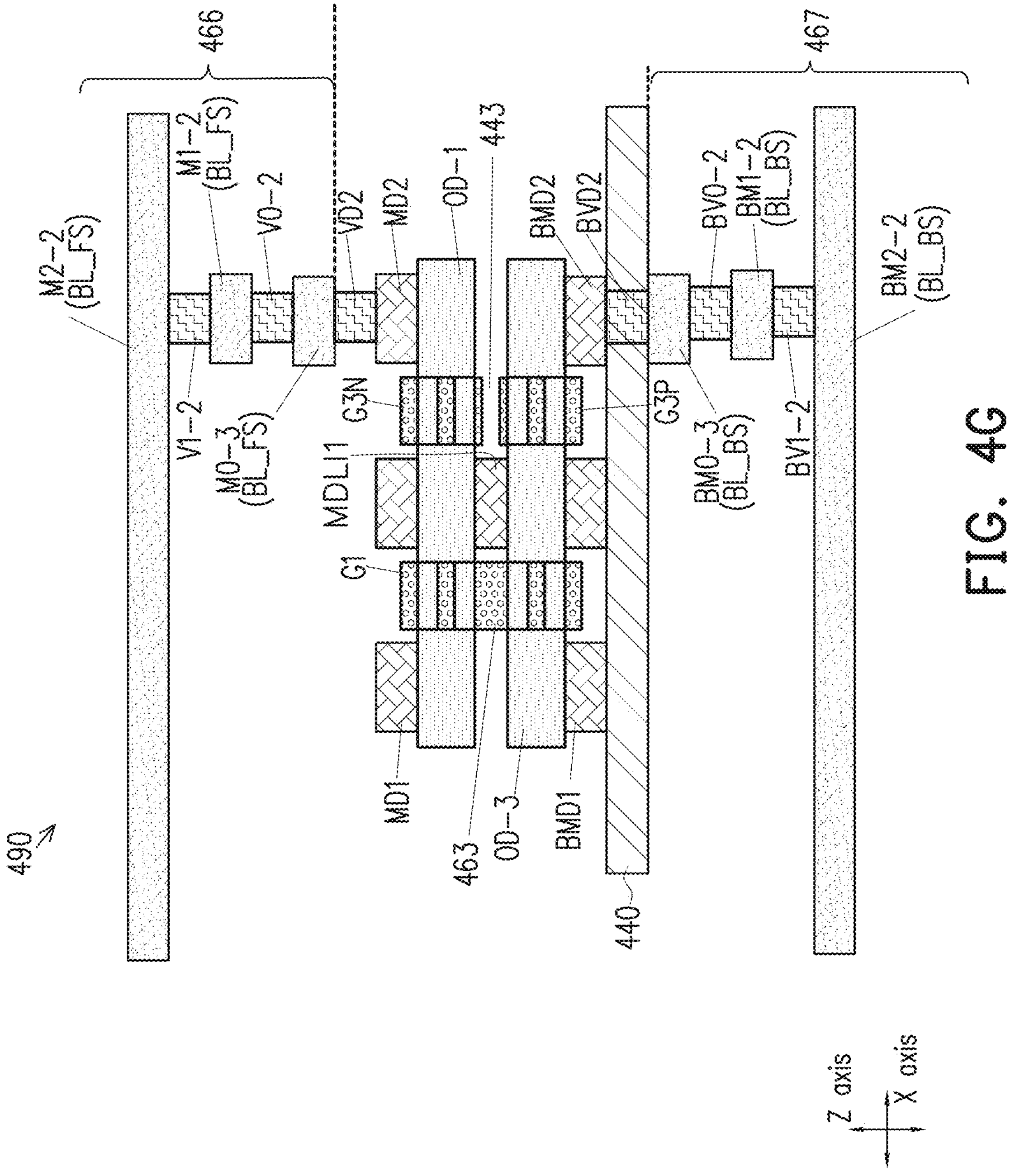

FIG. 4G is a schematic cross-sectional view of a portion of a memory device 490, in accordance with some embodiments. FIG. 4G is an X axis cross-sectional view similar to FIG. 4A, and shows a configuration in which the M0 conductive pattern M0-3 is electrically coupled by a via V0-2, an M1 conductive pattern M1-2, and a via V1-2, to an M2 conductive pattern M2-2 that extends continuously along the X axis across multiple memory cells in a memory column and configures a front side bit line in the M2 layer. Similarly, the BM0 conductive pattern BM0-3 is electrically coupled by a via BV0-2, an BM1 conductive pattern BM1-2, and a via BV1-2, to an BM2 conductive pattern BM2-2 that extends continuously along the X axis across multiple memory cells in the memory column and configures a back side bit line in the BM2 layer. In at least one embodiment, one or more advantages described herein are achievable by the memory device 490.

Figure 5A:
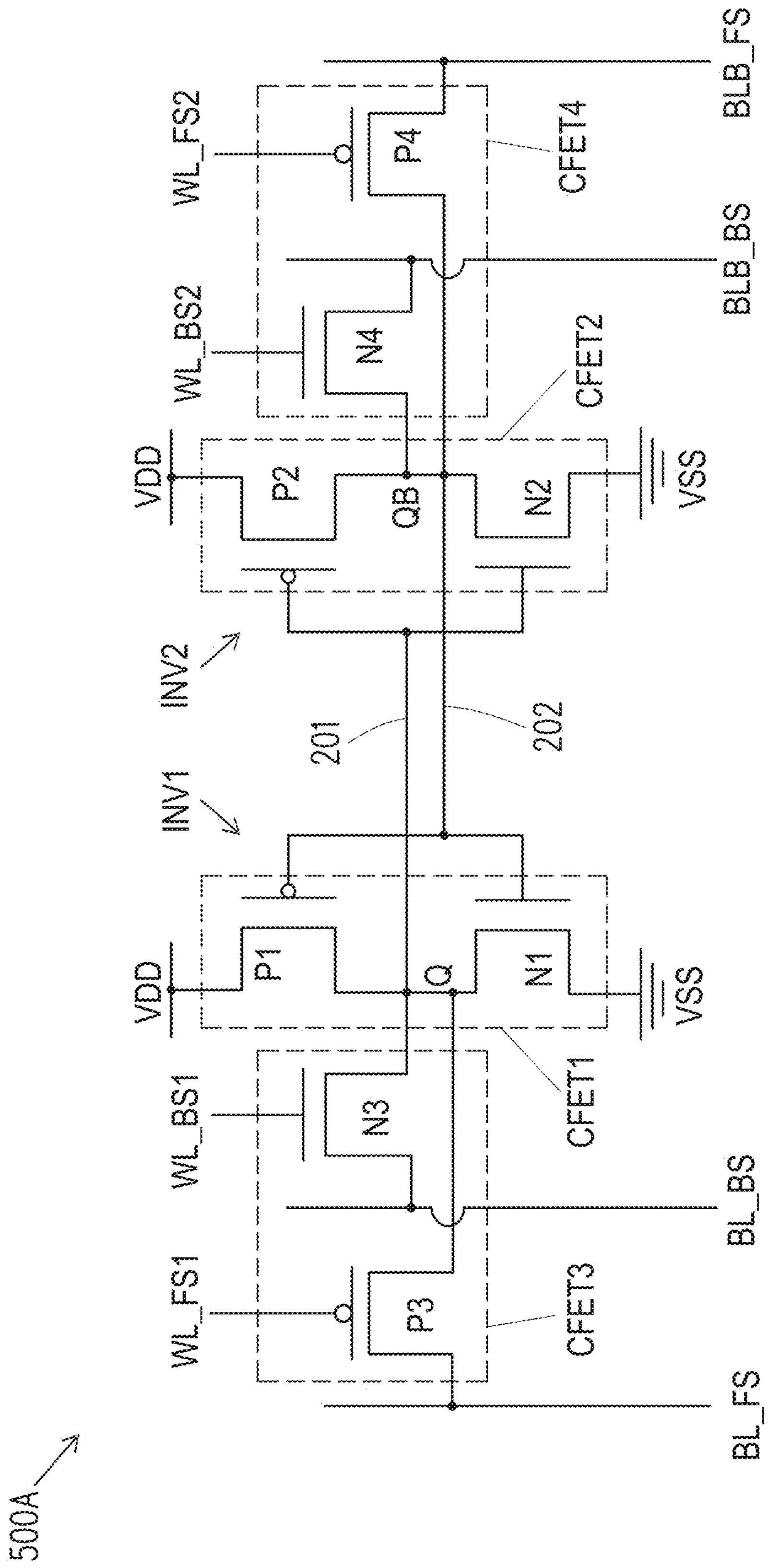
FIG. 5A is a schematic circuit diagram of a memory cell, in accordance with some embodiments.

FIG. 5A is a schematic circuit diagram of a memory cell 500A, in accordance with some embodiments. For simplicity, corresponding components in FIG. 2 and FIG. 5A are designated by the same reference numerals. The memory cell 500A comprises transistors N1-N4 and transistors P1-P4 coupled to each other in manners similar to the memory cell 200. Differences between the memory cell 200 and memory cell 500A are as follows.

In the memory cell 200, transistors N3, N4 are electrically coupled to front side word lines and bit lines, whereas transistors P3, P4 are electrically coupled to back side word lines and bit lines. In contrast, in the memory cell 500A, transistors N3, N4 are electrically coupled to back side word lines and bit lines, whereas transistors P3, P4 are electrically coupled to front side word lines and bit lines. Specifically, the transistor N3 is electrically coupled between a first back side bit line BL_BS and the node Q. A gate of the transistor N3 is electrically coupled to a first back side word line WL_BS1. The transistor N4 is electrically coupled between a second back side bit line BLB_BS and the node QB. A gate of the transistor N4 is electrically coupled to a second back side word line WL_BS2. The transistor P3 is electrically coupled between a first front side bit line BL_FS and the node Q. A gate of the transistor P3 is electrically coupled to a first front side word line WL_FS1. The transistor P4 is electrically coupled between a second front side bit line BLB_FS and the node QB. A gate of the transistor P4 is electrically coupled to a second front side word line WL_FS2.

Further, in contrast to the memory cell 200 in which the devices CFET1-CFET4 have an N-on-P structure, the devices CFET1-CFET4 in the memory cell 500A have a P-on-N structure. In at least one embodiment, one or more advantages described herein are achievable by a memory device comprising one or more memory cells 500A.

Figure 5B:
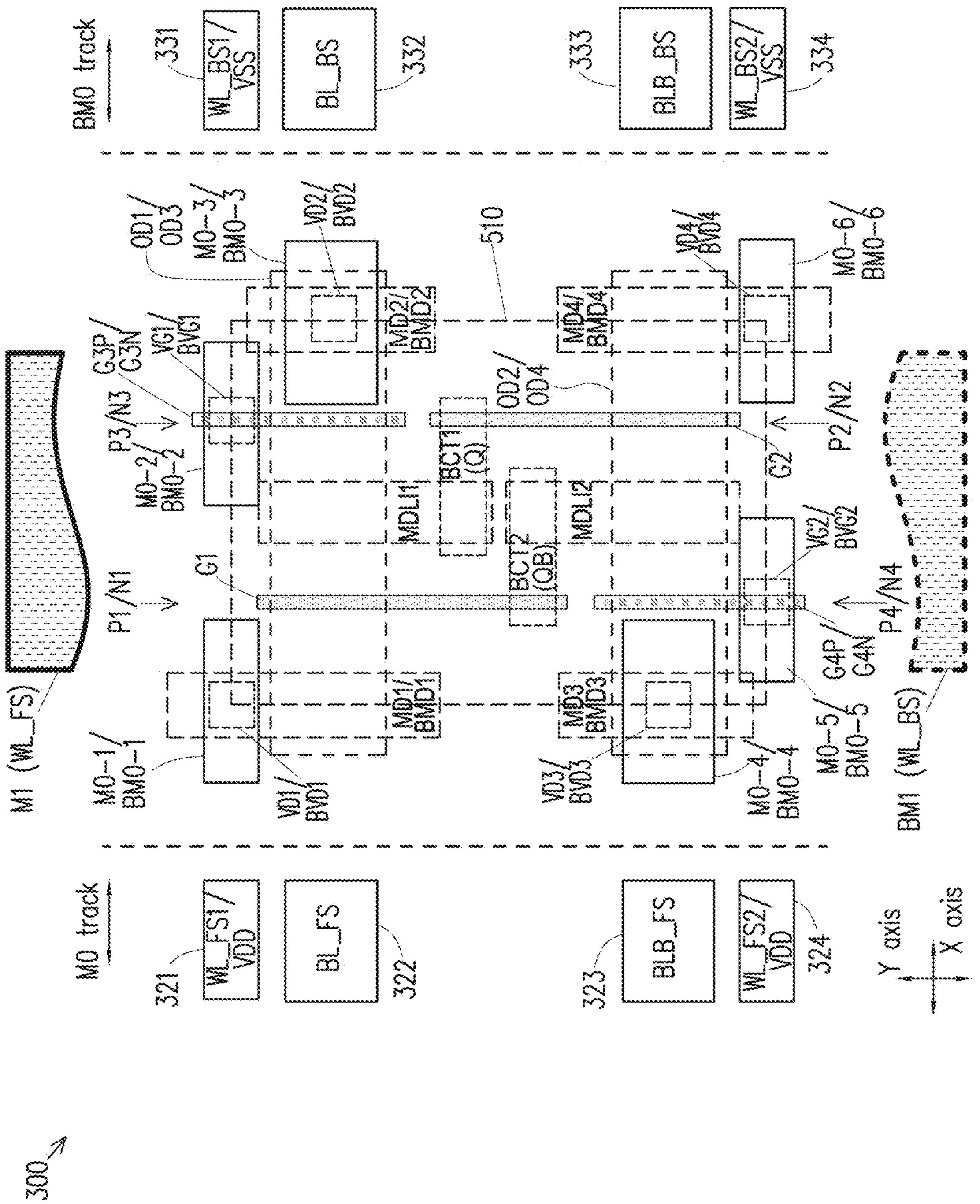
FIG. 5B is a schematic view of a layout diagram of a memory cell, in accordance with some embodiments.

FIG. 5B is a schematic view of a layout diagram of a memory cell 500B, in accordance with some embodiments. In some embodiments, the memory cell 500B corresponds to the memory cell 500A, and/or to one or more of the memory cells in one or more of the memory segments of the memory device 100. In some embodiments, the layout diagram of the memory cell 500B is stored in a cell library and/or on a non-transitory computer readable recording medium. For simplicity, corresponding components in FIG. 3C and FIG. 5B are designated by the same reference numerals. The layout diagram of the memory cell 500B in FIG. 5B is similar to the layout diagram of the memory cell 300 in FIG. 3C, with the differences being discussed herein.

The layout diagram of memory cell 500B in FIG. 5B reflects the P-on-N structure of the corresponding CFET devices. For example, the gates of the transistors P1-P4 are over the gates of the transistors N1-N4, and the PMOS active regions OD3, OD4 are over the NMOS active regions OD1, OD2. Further, the designations of VDD and VSS switch place between FIG. 3C and FIG. 5B. For example, M0 conductive patterns M0-1, M0-6 are configured for VDD, and BM0 conductive patterns BM0-1, BM0-6 are configured for VSS. In at least one embodiment, one or more advantages described herein are achievable by a memory device comprising one or more memory cells 500B.

Figure 6:
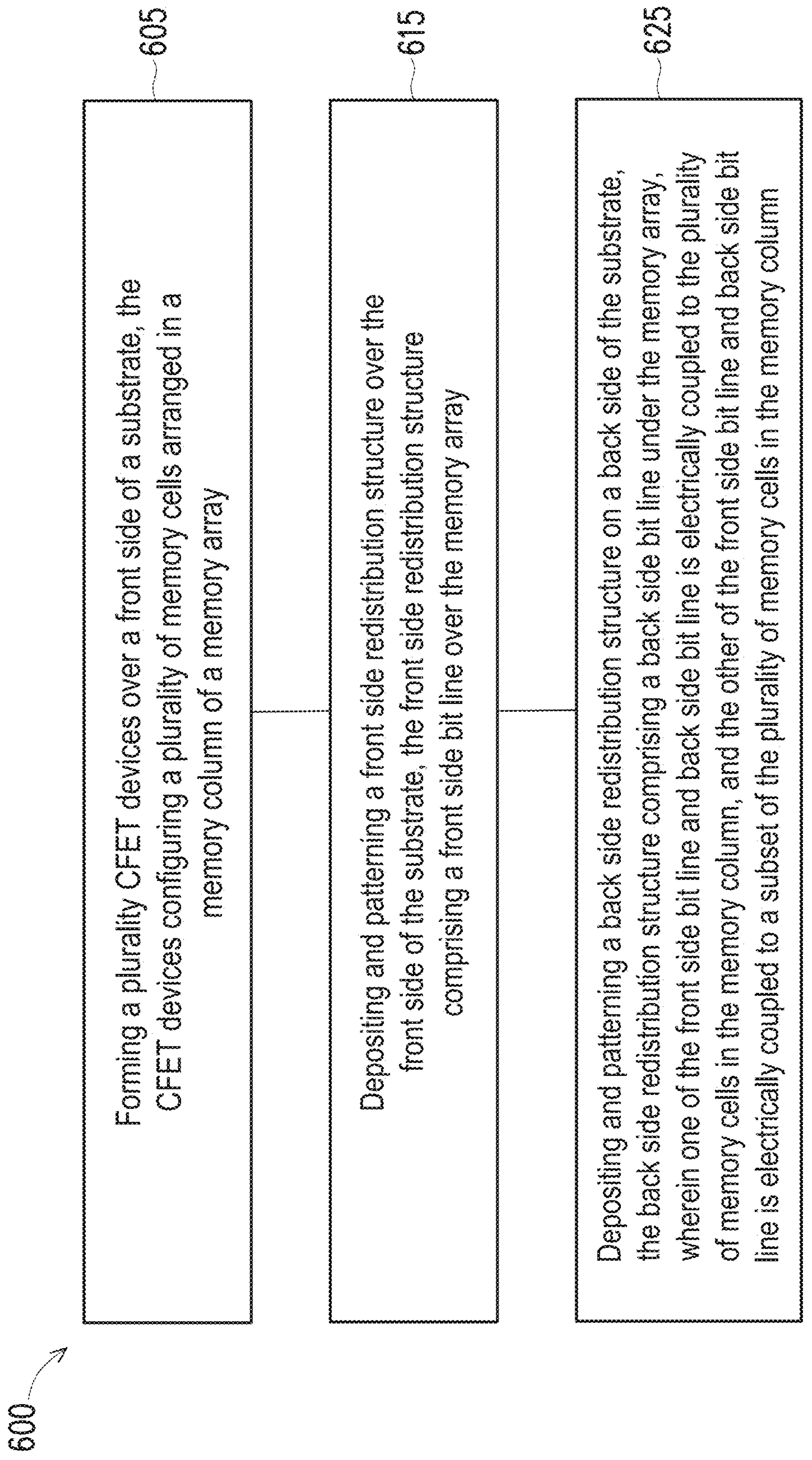
FIG. 6 is a flowchart of a method of manufacturing an IC device, in accordance with some embodiments.

FIG. 6 is a flowchart of a method 600 of manufacturing an IC device, in accordance with some embodiments. In some embodiments, the method 600 is usable to manufacture one or more memory devices as described herein.

At operation 605, a plurality CFET devices is formed over a front side of a substrate, the CFET devices configuring a plurality of memory cells arranged in a memory column of a memory array. For example, various CFET devices are formed over a front side 441 of a substrate 440 to configure memory cells as described with respect to one or more of FIGS. 4A-4G.

Referring to FIGS. 4A-4G, an example manufacturing process starts from the substrate 440. In some embodiments, the substrate 440 is a silicon-on-insulator (SOI) substrate having a semiconductor bulk, and an insulation layer over the semiconductor bulk. Other substrate configurations are within the scopes of various embodiments.

Alternating layers of a first semiconductor material and a second semiconductor material different from the first semiconductor material are sequentially deposited over the front side 441 of the substrate 440. In some embodiments, the first semiconductor material comprises silicon, and the second semiconductor material comprises SiGe. As a result, alternating SiGe/Si/SiGe/Si layers are stacked over the front side 441 of the substrate 440. In some embodiments, the alternating layers SiGe/Si/SiGe/Si are formed by an epitaxy process. Other materials and/or manufacturing processes for the alternating layers of the different first and second semiconductor materials are within the scopes of various embodiments.

In some embodiments, dummy gate structures (not shown) are formed over the alternating layers SiGe/Si/SiGe/Si, to be used as a mask for subsequent patterning, and for later formation of a metal gate. In an example, each dummy gate structure includes various dummy layers, such as a dummy gate electrode (e.g., polysilicon), a hard mask layer (e.g., SiN, SiCN, SiO, or the like). The dummy gate structures are formed by deposition processes, lithography processes, etching processes, combinations thereof, or the like. The alternating layers SiGe/Si/SiGe/Si are patterned by using the dummy gate structures as a mask.

Various semiconductor devices are next fabricated. In at least one embodiment, isolation regions are formed in trenches to separate and electrically isolate active regions of the devices to be manufactured. In some embodiments, one or more dielectric materials, such as SiO and/or SiN, are deposited, e.g., by chemical vapor deposition (CVD), plasma enhanced CVD (PECVD), atomic layer deposition (ALD), physical vapor deposition (PVD), thermal oxidation, or the like. Subsequently, the dielectric material is recessed, e.g., by etching and/or chemical mechanical polishing (CMP) to form the isolation regions.

In some embodiments, SiGe at exposed edges of the alternating layers SiGe/Si/SiGe/Si arc selectively removed by an etching process. In some embodiments, the selective removal of SiGe include an oxidation process followed by a selective etching.

In some embodiments, source/drains features similar to the source/drains 464, 465 are epitaxially grown as epitaxy structures. The source/drain features are grown to be in contact with the exposed edges of the Si layers. Example epitaxy processes include, but are not limited to, CVD deposition, ultra-high vacuum CVD (UHV-CVD), low-pressure CVD (LPCVD), plasma-enhanced CVD (PECVD), selective epitaxial growth (SEG) or the like.

In some embodiments, a metal gate replacement process is performed to replace the dummy gate structures with metal gate structures. In some embodiments, the dummy gate structures are removed by one or more etching processes, such as wet etching, dry etching, or the like. The SiGe layers are selectively removed by a selective oxidation/etching process. The Si layers remain, and configure nanosheets 461, 462 for top and bottom semiconductor devices. Metal gate structures are formed to wrap around the nanosheets 461, 462. In some embodiments, each metal gate structure includes a gate dielectric wrapping around the nanosheets 461, 462, and a metal gate, e.g., gate G1, over the gate dielectric to obtain corresponding top and bottom semiconductor devices, e.g., transistors N1, P1. Example materials of the gate dielectric includes a high-k dielectric material, such as HfO2, HfSiO, HfSiO4, HfSiON, HfLaO, HfTaO, HfTiO, HfZrO, HfAlOx, ZrO, ZrO2, ZrSiO2, AlO, AlSiO, Al2O3, TiO, TiO2, LaO, LaSiO, Ta2O3, Ta2O5, Y2O3, SrTiO3, BaZrO, BaTiO3 (BTO), (Ba,Sr)TiO3 (BST), Si3N4, hafnium dioxide-alumina (HfO2-Al2O3) alloy, or the like. In some embodiments, the gate dielectric is deposited by CVD, PVD, ALD, or the like. In some embodiments, each metal gate includes one or more metals such as Al, Cu, W, Ti, Ta, TiN, TaN, NiSi, CoSi, and is formed by, e.g., CVD, ALD, PVD, plating, chemical oxidation, thermal oxidation, or the like.

One or more interconnects MDLI, MD contact structures, VD vias, VG vias are formed, e.g., by etching and metal depositing operations. As a result of operation 605, a memory array is obtained in which a plurality of memory cells are arranged in a memory column, for example, as described with respect to FIG. 1.

At operation 615, deposition and patterning operations are performed to form a front side redistribution structure over the front side of the substrate, the front side redistribution structure comprising a front side bit line over the memory array. For example, a front side redistribution structure 466 is formed over the front side 441 of the substrate 440. The front side redistribution structure 466 comprises a front side bit line, such as one or more of M0 conductive patterns M0-3, M0-4, M2 conductive pattern M2-2, as described herein with respect to one or more of FIGS. 4A, 4B, 4G.

At operation 625, deposition and patterning operations are performed to form a back side redistribution structure on the back side of the substrate, the back side redistribution structure comprising a back side bit line under the memory array. For example, after forming the front side redistribution structure 466, the IC device being manufactured is flipped upside down and temporarily bonded to a carrier. Wafer thinning is performed from the back side 442 (now facing upward) to remove a portion of the substrate 440. In some embodiments, the wafer thinning process includes a grinding operation, a polishing operation (such as, chemical mechanical polishing (CMP)), or the like. In at least one embodiment, an original substrate for forming the CFET devices is completely removed, and a new substrate, e.g., an insulation substrate, is formed over the CFET devices. A back side redistribution structure 467 is formed over the back side 442 of the substrate 440 by deposition and patterning operations. The back side redistribution structure 467 comprises a back side bit line, such as one or more of BM0 conductive patterns BM0-3, BM0-4, BM2 conductive pattern BM2-2, as described herein with respect to one or more of FIGS. 4A, 4B, 4G.

As a result of operations 615, 625, one of the front side bit line and back side bit line is electrically coupled to the plurality of memory cells in the memory column, whereas the other of the front side bit line and back side bit line is electrically coupled to a subset of the plurality of memory cells in the memory column. For example, as described with respect to FIG. 1, the global bit line Global BL0 (or Global BLB0) is electrically coupled to the plurality of memory cells in the memory column C[0], whereas the local bit line Local BL0 (or Local BLB0) is electrically coupled to a subset of the memory cells in the memory segment 104. As described with respect to FIG. 2, the global bit line Global BL0 (or Global BLB0) is a front side bit line BL_FS and the local bit line Local BL0 is a back side bit line BL_BS, or vice versa.

In some embodiments, one or more advantages described herein are achievable by one or more IC devices manufactured by the method 600. Although the described manufacturing processes include formation of nanosheet devices in one or more embodiments, other types of devices, e.g., nanowire, FinFET, planar, or the like, are within the scopes of various embodiments. The described manufacturing processes and/or orders of operations are examples. Other manufacturing processes and/or orders of operations are within the scopes of various embodiments.

Figure 7:
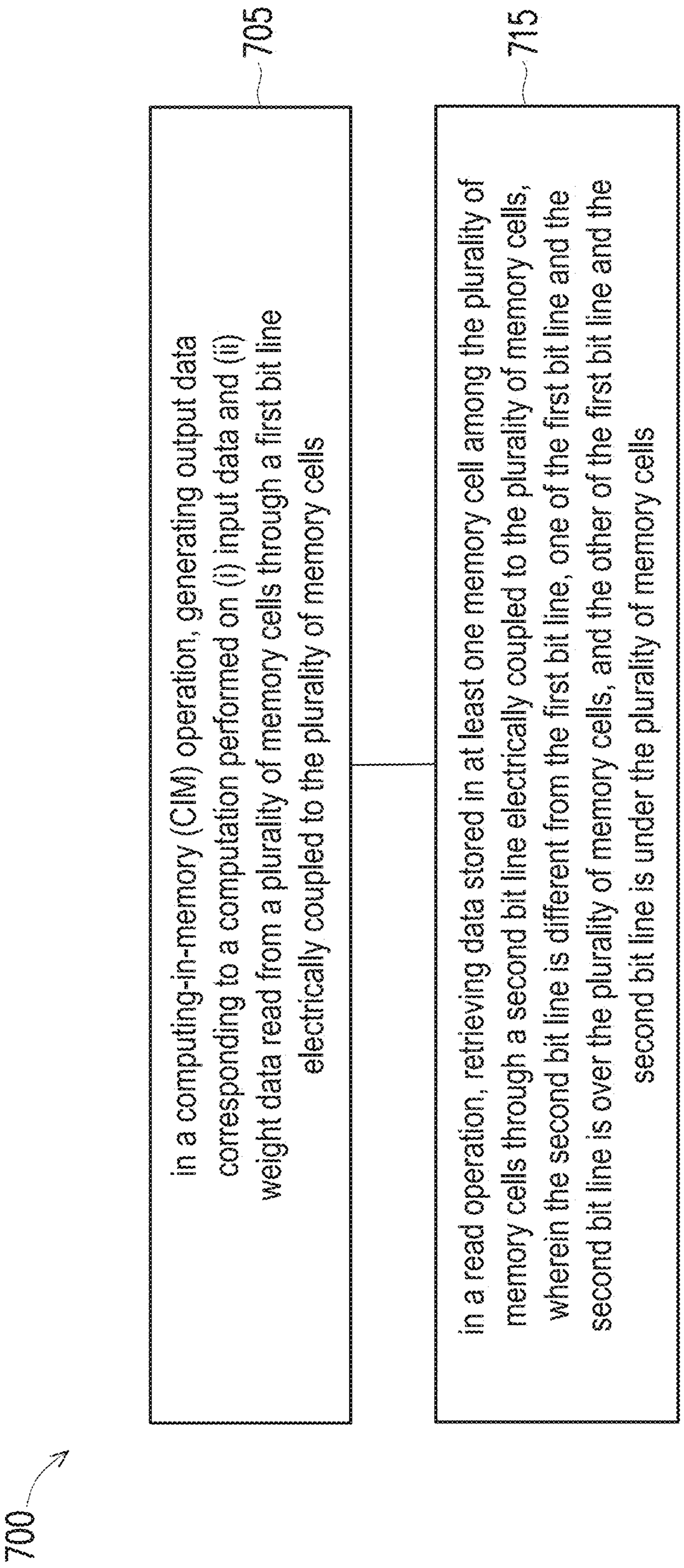
FIG. 7 is a flowchart of a method of operating a memory device, in accordance with some embodiments.

FIG. 7 is a flowchart of a method 700 of operating a memory device, in accordance with some embodiments. In some embodiments, the method 700 is usable to operate one or more memory devices as described herein.

At operation 705, in a computing-in-memory (CIM) operation, the method 700 comprises generating output data corresponding to a computation performed on (i) input data and (ii) weight data read from a plurality of memory cells through a first bit line electrically coupled to the plurality of memory cells. For example, as described with respect to FIG. 1, the memory cells in the memory segment 104 are sequentially accessed, the weight data stored in the memory segment 104 are sequentially read out and supplied, through the local bit line Local BL0, to the LCC 119. The LCC 119 is configured to perform a computation based on the weight data and the input data, to generate corresponding output data.

At operation 715, in a read operation, the method 700 comprises retrieving data stored in at least one memory cell among the plurality of memory cells through a second bit line electrically coupled to the plurality of memory cells, wherein the second bit line is different from the first bit line. For example, as described with respect to FIG. 1, one or more memory cells along the memory column C[0] are selected in a read operation, and data stored in the one or more memory cells are read out, through a different bit line, i.e., one or more of the global bit lines Global BL0, Global BLB0, and detected or sensed by a SA 125.

In operations 705, 715, one of the first bit line for the CIM operation and the second bit line for the read operation is over the plurality of memory cells, whereas the other bit line is under the plurality of memory cells. For example, as described with respect to FIG. 2, the global bit line Global BL0 (or Global BLB0) is a front side bit line BL_FS and the local bit line Local BL0 is a back side bit line BL_BS, or vice versa.

In some embodiments, the CIM operation and the read operation are performed without electrically coupling the first bit line (e.g., the local bit line Local BL0) to the second bit line (e.g., one or more of the global bit lines Global BL0, Global BLB0).

In some embodiments, by using different bit lines on opposite sides of the memory array for a CIM operation and a read operation, it is possible to achieve one or more advantages as described herein.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, at least one method(s) discussed above is performed in whole or in part by at least one EDA system. In some embodiments, an EDA system is usable as part of a design house of an IC manufacturing system discussed below.

Figure 8:
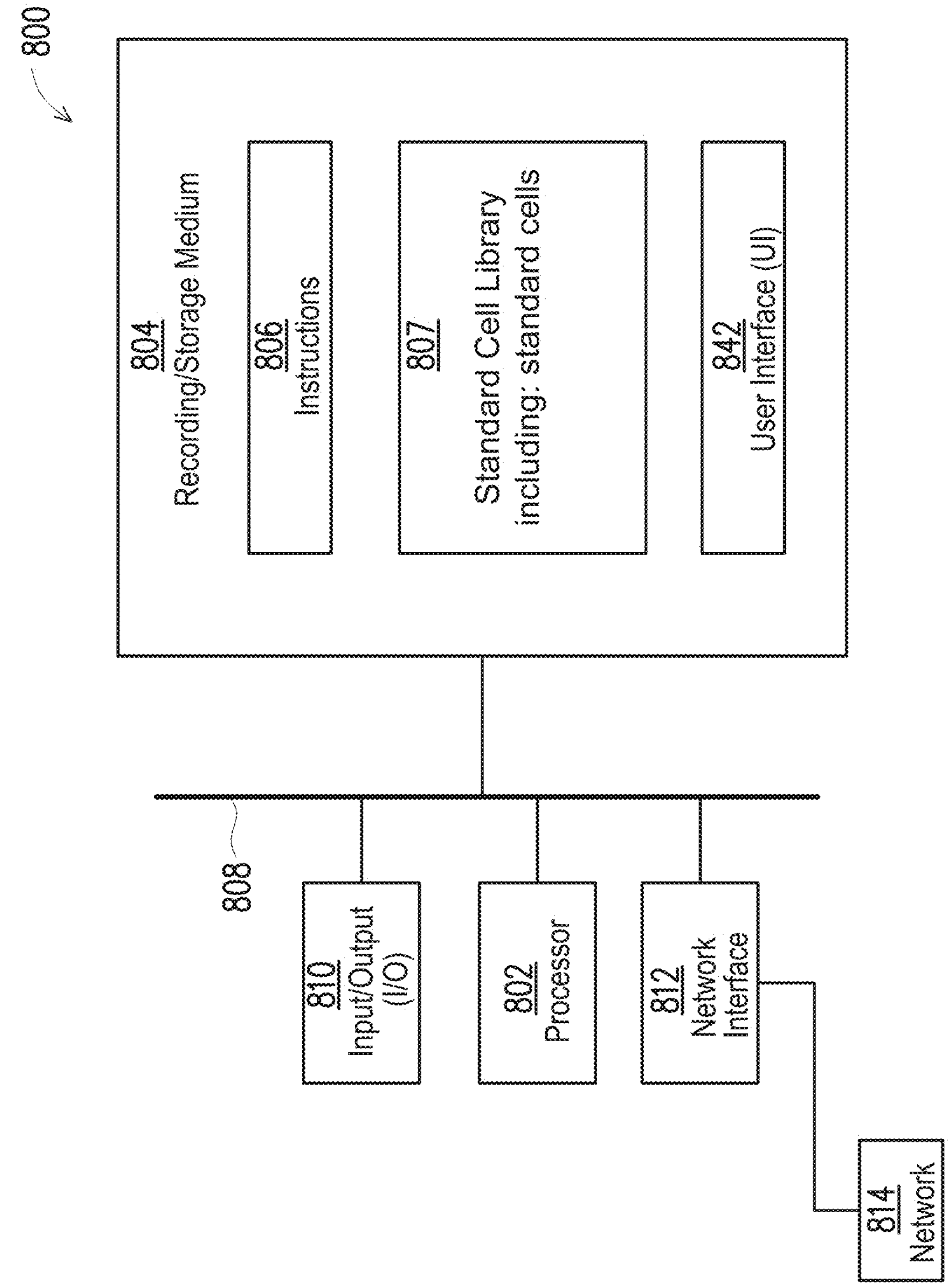
FIG. 8 is a block diagram of an electronic design automation (EDA) system in accordance with some embodiments.

FIG. 8 is a block diagram of an electronic design automation (EDA) system 800 in accordance with some embodiments.

In some embodiments, EDA system 800 includes an APR system. Methods described herein of designing layout diagrams represent wire routing arrangements, in accordance with one or more embodiments, are implementable, for example, using EDA system 800, in accordance with some embodiments.

In some embodiments, EDA system 800 is a general purpose computing device including a hardware processor 802 and a non-transitory, computer-readable recording medium 804. Storage medium 804, amongst other things, is encoded with, i.e., stores, computer program code 806, i.e., a set of executable instructions. Execution of instructions 806 by hardware processor 802 represents (at least in part) an EDA tool which implements a portion or all of the methods described herein in accordance with one or more embodiments (hereinafter, the noted processes and/or methods).

Processor 802 is electrically coupled to computer-readable recording medium 804 via a bus 808. Processor 802 is also electrically coupled to an I/O interface 810 by bus 808. A network interface 812 is also electrically connected to processor 802 via bus 808. Network interface 812 is connected to a network 814, so that processor 802 and computer-readable recording medium 804 are capable of connecting to external elements via network 814. Processor 802 is configured to execute computer program code 806 encoded in computer-readable recording medium 804 in order to cause system 800 to be usable for performing a portion or all of the noted processes and/or methods. In one or more embodiments, processor 802 is a central processing unit (CPU), a multi-processor, a distributed processing system, an application specific integrated circuit (ASIC), and/or a suitable processing unit.

In one or more embodiments, computer-readable recording medium 804 is an electronic, magnetic, optical, electromagnetic, infrared, and/or a semiconductor system (or apparatus or device). For example, computer-readable recording medium 804 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable recording medium 804 includes a compact disk-read only memory (CD-ROM), a compact disk-read/write (CD-R/W), and/or a digital video disc (DVD).

In one or more embodiments, storage medium 804 stores computer program code 806 configured to cause system 800 (where such execution represents (at least in part) the EDA tool) to be usable for performing a portion or all of the noted processes and/or methods. In one or more embodiments, storage medium 804 also stores information which facilitates performing a portion or all of the noted processes and/or methods. In one or more embodiments, storage medium 804 stores library 807 of standard cells including such standard cells as disclosed herein.

EDA system 800 includes I/O interface 810. I/O interface 810 is coupled to external circuitry. In one or more embodiments, I/O interface 810 includes a keyboard, keypad, mouse, trackball, trackpad, touchscreen, and/or cursor direction keys for communicating information and commands to processor 802.

EDA system 800 also includes network interface 812 coupled to processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 800.

System 800 is configured to receive information through I/O interface 810. The information received through I/O interface 810 includes one or more of instructions, data, design rules, libraries of standard cells, and/or other parameters for processing by processor 802. The information is transferred to processor 802 via bus 808. EDA system 800 is configured to receive information related to a UI through I/O interface 810. The information is stored in computer-readable recording medium 804 as user interface (UI) 842.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 800. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 9:
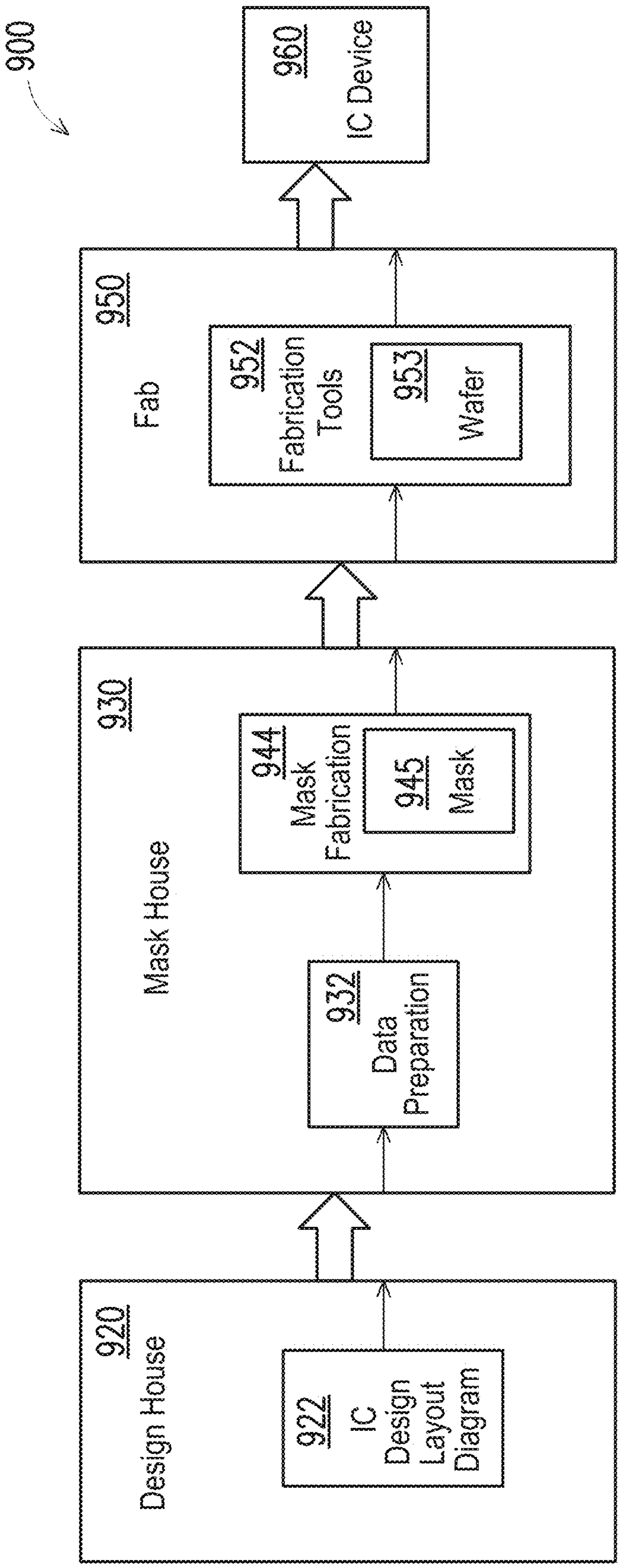
FIG. 9 is a block diagram of an IC device manufacturing system, and an IC manufacturing flow associated therewith, in accordance with some embodiments.

FIG. 9 is a block diagram of an integrated circuit (IC) manufacturing system 900, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 900.

In FIG. 9, IC manufacturing system 900 includes entities, such as a design house 920, a mask house 930, and an IC manufacturer/fabricator ("fab") 950, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 950 is owned by a single larger company. In some embodiments, two or more of design house 920, mask house 930, and IC fab 950 coexist in a common facility and use common resources.

Design house (or design team) 920 generates an IC design layout diagram 922. IC design layout diagram 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout diagram 922 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout diagram 922. The design procedure includes one or more of logic design, physical design or place-and-route operation. IC design layout diagram 922 is presented in one or more data files having information of the geometrical patterns. For example, IC design layout diagram 922 can be expressed in a GDSII file format or DFII file format.

Mask house 930 includes data preparation 932 and mask fabrication 944. Mask house 930 uses IC design layout diagram 922 to manufacture one or more masks 945 to be used for fabricating the various layers of IC device 960 according to IC design layout diagram 922. Mask house 930 performs mask data preparation 932, where IC design layout diagram 922 is translated into a representative data file ("RDF"). Mask data preparation 932 provides the RDF to mask fabrication 944. Mask fabrication 944 includes a mask writer. A mask writer converts the RDF to an image on a substrate, such as a mask (reticle) 945 or a semiconductor wafer 953. The design layout diagram 922 is manipulated by mask data preparation 932 to comply with particular characteristics of the mask writer and/or requirements of IC fab 950. In FIG. 9, mask data preparation 932 and mask fabrication 944 are illustrated as separate elements. In some embodiments, mask data preparation 932 and mask fabrication 944 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout diagram 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout diagram 922 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 922 to compensate for limitations during mask fabrication 944, which may undo part of the modifications performed by OPC in order to meet mask creation rules.

In some embodiments, mask data preparation 932 includes lithography process checking (LPC) that simulates processing that will be implemented by IC fab 950 to fabricate IC device 960. LPC simulates this processing based on IC design layout diagram 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 922.

It should be understood that the above description of mask data preparation 932 has been simplified for the purposes of clarity. In some embodiments, data preparation 932 includes additional features such as a logic operation (LOP) to modify the IC design layout diagram 922 according to manufacturing rules. Additionally, the processes applied to IC design layout diagram 922 during data preparation 932 may be executed in a variety of different orders.

After mask data preparation 932 and during mask fabrication 944, a mask 945 or a group of masks 945 are fabricated based on the modified IC design layout diagram 922. In some embodiments, mask fabrication 944 includes performing one or more lithographic exposures based on IC design layout diagram 922. In some embodiments, an electron-beam (e-beam) or a mechanism of multiple e-beams is used to form a pattern on a mask (photomask or reticle) 945 based on the modified IC design layout diagram 922. Mask 945 can be formed in various technologies. In some embodiments, mask 945 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 945 includes a transparent substrate (e.g., fused quartz) and an opaque material (e.g., chromium) coated in the opaque regions of the binary mask. In another example, mask 945 is formed using a phase shift technology. In a phase shift mask (PSM) version of mask 945, various features in the pattern formed on the phase shift mask are configured to have proper phase difference to enhance the resolution and imaging quality. In various examples, the phase shift mask can be attenuated PSM or alternating PSM. The mask(s) generated by mask fabrication 944 is used in a variety of processes. For example, such a mask(s) is used in an ion implantation process to form various doped regions in semiconductor wafer 953, in an etching process to form various etching regions in semiconductor wafer 953, and/or in other suitable processes.

IC fab 950 is an IC fabrication business that includes one or more manufacturing facilities for the fabrication of a variety of different IC products. In some embodiments, IC Fab 950 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 950 includes fabrication tools 952 configured to execute various manufacturing operations on semiconductor wafer 953 such that IC device 960 is fabricated in accordance with the mask(s), e.g., mask 945. In various embodiments, fabrication tools 952 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein. IC fab 950 uses mask(s) 945 fabricated by mask house 930 to fabricate IC device 960.

Thus, IC fab 950 at least indirectly uses IC design layout diagram 922 to fabricate IC device 960. In some embodiments, semiconductor wafer 953 is fabricated by IC fab 950 using mask(s) 945 to form IC device 960. In some embodiments, the IC fabrication includes performing one or more lithographic exposures based at least indirectly on IC design layout diagram 922. Semiconductor wafer 953 includes a silicon substrate or other proper substrate having material layers formed thereon. Semiconductor wafer 953 further includes one or more of various doped regions, dielectric features, multilevel interconnects, and the like (formed at subsequent manufacturing steps).

In some embodiments, an integrated circuit (IC) device comprises a plurality of memory segments. Each memory segment comprises a plurality of memory cells, and a local bit line electrically coupled to the plurality of memory cells and arranged on a first side of the IC device. The IC device further comprises a global bit line electrically coupled to the plurality of memory segments, and arranged on a second side of the IC device. The second side is opposite the first side in a thickness direction of the IC device.

In some embodiments, a memory cell comprises a plurality of complementary field-effect transistor (CFET) devices, a first bit line and a first word line arranged on a first side of the plurality of CFET devices, and a second bit line and a second word line arranged on a second side of the plurality of CFET devices. The second side is opposite the first side in a thickness direction of the CFET devices. The plurality of CFET devices comprises a first semiconductor device and a second semiconductor device. The first semiconductor device comprises a gate electrically coupled to the first word line, a first source/drain electrically coupled to the first bit line, and a second source/drain. The second semiconductor device comprises a gate electrically coupled to the second word line, a first source/drain electrically coupled to the second bit line, and a second source/drain electrically coupled to the second source/drain of the first semiconductor device.

In some embodiments, a method comprises, in a computing-in-memory (CIM) operation, generating output data corresponding to a computation performed on (i) input data and (ii) weight data read from a plurality of memory cells through a first bit line electrically coupled to the plurality of memory cells. The method further comprises, in a read operation, retrieving data stored in at least one memory cell among the plurality of memory cells through a second bit line electrically coupled to the plurality of memory cells, the second bit line different from the first bit line. One of the first bit line and the second bit line is over the plurality of memory cells, and the other of the first bit line and the second bit line is under the plurality of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:

a plurality of memory segments, at least one memory segment of the plurality of memory segments comprising:

a plurality of memory cells; and a local bit line electrically coupled to the plurality of memory cells, and arranged on a first side of the IC device;

a global bit line electrically coupled to the plurality of memory segments, and arranged on a second side of the IC device, the second side opposite the first side in a thickness direction of the IC device; and for at least one memory cell among the plurality of memory cells in the at least one memory segment, a first word line arranged on the first side, and electrically coupled to the at least one memory cell, and a second word line arranged on the second side, and electrically coupled to the at least one memory cell, wherein the at least one memory cell comprises:

a first complementary field-effect transistor (CFET) device comprising:

a first semiconductor device comprising:

a gate electrically coupled to the first word line, a first source/drain electrically coupled to the global bit line, and a second source/drain, and a second semiconductor device comprising:

a gate electrically coupled to the second word line, a first source/drain electrically coupled to the local bit line, and a second source/drain electrically coupled to the second source/drain of the first semiconductor device, and a second CFET device comprising:

a third semiconductor device comprising:

a gate electrically coupled to the first word line, a first source/drain electrically coupled to a further global bit line, the global bit line and the further global bit line forming a pair of differential bit lines, and a second source/drain, and a fourth semiconductor device comprising:

a gate electrically coupled to the second word line, a first source/drain electrically coupled to a further local bit line, the local bit line and the further local bit line forming a further pair of differential bit lines, and a second source/drain electrically coupled to the second source/drain of the third semiconductor device.

2. The IC device of claim 1, wherein the at least one memory cell among the plurality of memory cells is a static random- access memory (SRAM) cell.

3. The IC device of claim 1, wherein the at least one memory segment among the plurality of memory segments further comprises:

a local computation circuit electrically coupled to the local bit line, and configured to generate output data corresponding to a computation performed on (i) input data and (ii) weight data stored in the plurality of memory cells of the at least one memory segment.

4. The IC device of claim 3, further comprising:

a sense amplifier electrically coupled to the global bit line, and configured to detect data stored in the plurality of memory segments.

5. The IC device of claim 1, wherein the at least one memory cell further comprises:

a third CFET device configured as a first inverter, wherein an output of the first inverter is electrically coupled to the second source/drain of the first semiconductor device and the second source/drain of the second semiconductor device, and a fourth CFET device configured as a second inverter cross-coupled to the first inverter, wherein an output of the second inverter is electrically coupled to the second source/drain of the third semiconductor device and the second source/drain of the fourth semiconductor device.

6. The IC device of claim 5, wherein the first through fourth CFET devices are physically arranged immediately adjacent to each other in two rows each having two of the first through fourth CFET devices.

7. The IC device of claim 1, wherein the first semiconductor device and the second semiconductor device are physically stacked one over another in the thickness direction.

8. The IC device of claim 7, wherein one of the first semiconductor device and the second semiconductor device is an N-type transistor, and the other of the first semiconductor device and the second semiconductor device is a P-type transistor.

9. The IC device of claim 1, wherein the third semiconductor device and the fourth semiconductor device are physically stacked one over another in the thickness direction.

10. The IC device of claim 9, wherein one of the third semiconductor device and the fourth semiconductor device is an N-type transistor, and the other of the third semiconductor device and the fourth semiconductor device is a P-type transistor.

11. A memory cell, comprising:

a plurality of complementary field-effect transistor (CFET) devices;

a first bit line and a first word line arranged on a first side of the plurality of CFET devices; and a second bit line and a second word line arranged on a second side of the plurality of CFET devices, the second side opposite the first side in a thickness direction of the plurality of CFET devices, wherein the plurality of CFET devices comprises:

a first CFET device comprising:

a first semiconductor device comprising:

a gate electrically coupled to the first word line, a first source/drain electrically coupled to the first bit line, and a second source/drain, and a second semiconductor device comprising:

a gate electrically coupled to the second word line, a first source/drain electrically coupled to the second bit line, and a second source/drain electrically coupled to the second source/drain of the first semiconductor device.

12. The memory cell of claim 11, further comprising:

a third bit line arranged on the first side of the plurality of CFET devices; and a fourth bit line arranged on the second side of the plurality of CFET devices, wherein the first bit line and the third bit line form a pair of differential bit lines, and the second bit line and the fourth bit line form a further pair of differential bit lines.

13. The memory cell of claim 12, further comprising:

a third word line arranged on the first side of the plurality of CFET devices; and a fourth word line arranged on the second side of the plurality of CFET devices, wherein the first word line is physically spaced from, and electrically coupled to, the third word line, and the second word line is physically spaced from, and electrically coupled to, the fourth word line.

14. The memory cell of claim 13, wherein the plurality of CFET devices further comprises:

a second CFET device comprising:

a third semiconductor device comprising:

a gate electrically coupled to the third word line, a first source/drain electrically coupled to the third bit line, and a second source/drain, and a fourth semiconductor device comprising:

a gate electrically coupled to the fourth word line, a first source/drain electrically coupled to the fourth bit line, and a second source/drain electrically coupled to the second source/drain of the third semiconductor device.

15. The memory cell of claim 14, wherein the plurality of CFET devices further comprises:

a third CFET device configured as a first inverter, wherein an output of the first inverter is electrically coupled to the second source/drain of the first semiconductor device and the second source/drain of the second semiconductor device, and a fourth CFET device configured as a second inverter cross-coupled to the first inverter, wherein an output of the second inverter is electrically coupled to the second source/drain of the third semiconductor device and the second source/drain of the fourth semiconductor device.

16. The memory cell of claim 14, wherein the memory cell is a dual-port memory cell, the first semiconductor device and the third semiconductor device correspond to a first port of the dual-port memory cell, and the second semiconductor device and the fourth semiconductor device correspond to a second port of the dual-port memory cell.

17. The memory cell of claim 14, wherein the first word line overlaps the second word line along the thickness direction, the third word line overlaps the fourth word line along the thickness direction, the first bit line overlaps the second bit line along the thickness direction, and the third bit line overlaps the fourth bit line along the thickness direction.

18. The memory cell of claim 14, wherein the gates of the first through fourth semiconductor devices are elongated along a first direction, the first word line is physically spaced from the third word line along the first direction, and the second word line is physically spaced from the fourth word line along the first direction.

19. The memory cell of claim 11, wherein one of the first semiconductor device and the second semiconductor device is an N-type transistor, and the other of the first semiconductor device and the second semiconductor device is a P-type transistor, and the first semiconductor device and the second semiconductor device are physically stacked one over another in the thickness direction.

20. A method, comprising:

in a computing-in-memory (CIM) operation, generating output data corresponding to a computation performed on (i) input data and (ii) weight data read from a plurality of memory cells through a first bit line electrically coupled to the plurality of memory cells; and in a read operation, retrieving data stored in at least one memory cell among the plurality of memory cells through a second bit line electrically coupled to the plurality of memory cells, the second bit line different from the first bit line, wherein one of the first bit line and the second bit line is over the plurality of memory cells, the other of the first bit line and the second bit line is under the plurality of memory cells, and the CIM operation and the read operation are performed without electrically coupling the first bit line to the second bit line.

* * * * *